(12) United States Patent
Fuse et al.

(10) Patent No.: US 12,707,660 B2
(45) Date of Patent: Aug. 11, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kaori Fuse, Yokohama Kanagawa (JP); Keiko Kawamura, Yokohama Kanagawa (JP); Tomoko Matsudai, Tokyo (JP); Yoko Iwakaji, Tokyo (JP); Takako Motai, Yokohama Kanagawa (JP); Hiroko Itokazu, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 939 days.

(21) Appl. No.: 17/931,508

(22) Filed: Sep. 12, 2022

(65) Prior Publication Data

US 2023/0307555 A1 Sep. 28, 2023

(30) Foreign Application Priority Data

Mar. 22, 2022 (JP) ................................ 2022-044988
Jul. 27, 2022 (JP) ................................ 2022-119593

(51) Int. Cl.
*H10D 8/00* (2025.01)
*H10D 12/00* (2025.01)
*H10D 84/60* (2025.01)

(52) U.S. Cl.
CPC ........... *H10D 8/422* (2025.01); *H10D 12/481* (2025.01); *H10D 84/617* (2025.01)

(58) Field of Classification Search
None
See application file for complete search history.

(56) References Cited

U.S. PATENT DOCUMENTS 9,520,465 B2 12/2016 Yamashita et al.
9,536,961 B2 1/2017 Hirabayashi et al.
(Continued)

FOREIGN PATENT DOCUMENTS

JP 2013-048230 A 3/2013
JP 5919121 5/2016
(Continued)

OTHER PUBLICATIONS

Office Action issued in Japanese Patent Application No. 2022-119593, dated Jul. 15, 2025 in 17 pages.

*Primary Examiner* — Jessica S Manno
*Assistant Examiner* — Christopher A. Schodde
(74) *Attorney, Agent, or Firm* — Knobbe, Martens, Olson & Bear, LLP

(57) ABSTRACT

A semiconductor device includes a semiconductor part, first to fourth electrodes, and first and second insulating film. The first and second electrodes are provided on back and front surfaces of the semiconductor part, respectively. The third and fourth electrodes each extend into the semiconductor device form the front surface side. The third and fourth electrodes are electrically insulated from the semiconductor part by insulating films. The semiconductor part includes first to fourth layers. The first layer of a first conductivity type extends between the first and second electrodes. The second layer of a second conductivity type is provided between the first layer and the second electrode. The third layer of the second conductivity type is partially provided between the second layer and the second electrode. The fourth layer of the first conductivity type is provided in the second layer. The fourth layer is apart from the third layer.

20 Claims, 21 Drawing Sheets

(56) References Cited

U.S. PATENT DOCUMENTS

| | | | | |
|---|---|---|---|---|
| 10,770,453 | B2 | 9/2020 | Onozawa et al. | |
| 2007/0114598 | A1* | 5/2007 | Hotta | H10D 12/481 257/E29.066 |
| 2015/0255629 | A1* | 9/2015 | Gejo | H10D 8/01 257/656 |
| 2016/0172453 | A1* | 6/2016 | Hirabayashi | H10D 62/107 257/144 |
| 2016/0315140 | A1* | 10/2016 | Iwasaki | H01L 21/265 |
| 2017/0005186 | A1* | 1/2017 | Hirabayashi | H10D 62/127 |
| 2017/0141103 | A1* | 5/2017 | Kameyama | H10D 84/617 |
| 2019/0252533 | A1 | 8/2019 | Naito | |
| 2019/0287963 | A1* | 9/2019 | Kondoh | H10D 62/142 |
| 2020/0091329 | A1 | 3/2020 | Mitsuzuka et al. | |
| 2020/0105745 | A1 | 4/2020 | Obata et al. | |
| 2020/0357903 | A1 | 11/2020 | Kubouchi | |

FOREIGN PATENT DOCUMENTS

| | | |
|---|---|---|
| JP | 5922886 | 5/2016 |
| JP | 6053050 | 12/2016 |
| JP | 6077309 | 2/2017 |
| JP | 6293688 | 3/2018 |
| JP | 2020-74396 | 5/2020 |
| JP | 2021-73714 | 5/2021 |
| WO | WO 2018/220879 A1 | 12/2018 |
| WO | WO 2019/116748 | 6/2019 |
| WO | WO 2020/036015 | 2/2020 |
| WO | WO 2019/116696 | 6/2020 |

* cited by examiner 4
13
C
13
15
C
50
40
17
13
55
45
10
11
19
Z
Y
X 4
10F
15
13
Ih
17
17
Ie
Ie
13ex
11
Z
X
Y

SEMICONDUCTOR DEVICE

CROSS-REFERENCE TO RELATED APPLICATIONS

This application is based upon and claims the benefit of priority from Japanese Patent Application No. 2022-044988, filed on Mar. 22, 2022, and Japanese Patent Application No. 2022-119593, filed on Jul. 27, 2022; the entire contents of all of which are incorporated herein by reference.

FIELD

Embodiments relate to a semiconductor device.

BACKGROUND

A semiconductor device used for power conversion is required to reduce the switching loss.

DETAILED DESCRIPTION

Figure 1:
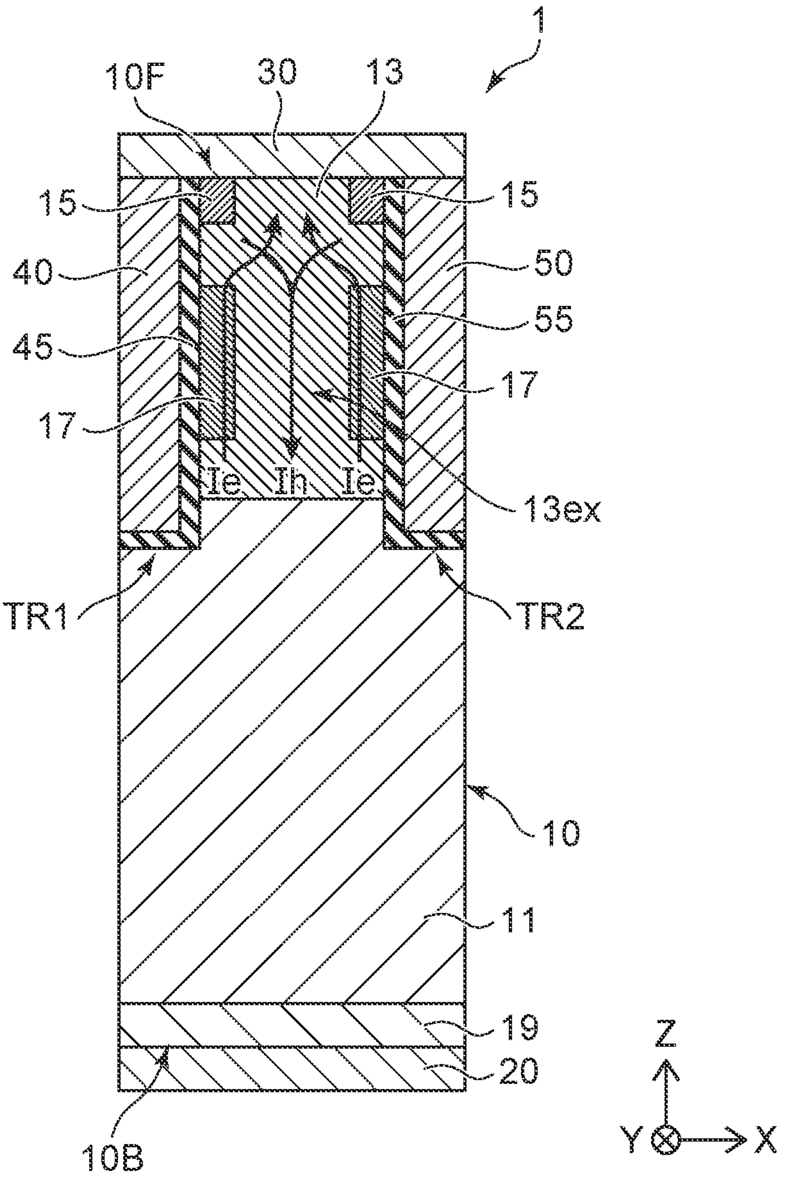
FIG. 1 is a schematic cross-sectional view showing a semiconductor device according to a first embodiment.

According to one embodiment, a semiconductor device includes a semiconductor part, first to fourth electrodes, and first and second insulating film. The first electrode is provided on a back surface of the semiconductor part. The second electrode is provided on a front surface of the semiconductor part, the front surface being at a side opposite to the back surface. The third electrode extends into the semiconductor device form the front surface side of the semiconductor part. The first insulating film is provided between the semiconductor part and the third electrode. The first insulating film electrically insulates the third electrode from the semiconductor part. The fourth electrode extends into the semiconductor device form the front surface side of the semiconductor part. The fourth electrode is provided at a position next to the first trench. The second insulating film is provided between the semiconductor part and the fourth electrode. The second insulating film electrically insulates the fourth electrode from the semiconductor part. The semiconductor part includes first to fourth semiconductor layers. The first semiconductor layer of a first conductivity type extends between the first electrode and the second electrode. The second semiconductor layer of a second conductivity type is provided between the first semiconductor layer and the second electrode and extends between the third electrode and the fourth electrode. The third semiconductor layer of the second conductivity type is partially provided on the second semiconductor layer between the second semiconductor layer and the second electrode. The third semiconductor layer includes a second-conductivity-type impurity with a higher concentration than the second semiconductor layer. The fourth semiconductor layer of the first conductivity type is provided in the second semiconductor layer between the third electrode and the fourth electrode. The third semiconductor layer is apart from the fourth semiconductor layer. The second semiconductor layer extends between the third semiconductor layer and the fourth semiconductor layer. The second electrode is connected to the second and third semiconductor layers at the front surface of the semiconductor part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is a diode. For example, the semiconductor device 1 is used as a freewheeling diode (FWD) included in an inverter. Also, for example, the semiconductor device 1 may be integrated with an IGBT (Insulated Gate Bipolar Transistor) in an RC-IGBT (Reverse Conducting IGBT).

The semiconductor device 1 includes a semiconductor part 10, a first electrode 20, a second electrode 30, a third electrode 40, and a fourth electrode 50. The semiconductor part 10 is, for example, silicon.

The first electrode 20 is provided on a back surface 10B of the semiconductor part 10. The first electrode 20 is, for example, a cathode electrode. The first electrode 20 is, for example, a metal layer that includes at least one selected from the group consisting of aluminum (Al), titanium (Ti), nickel (Ni), tungsten (W), gold (Au), platinum (Pt), etc.

The second electrode 30 is provided on a front surface 10F of the semiconductor part 10 at the side opposite to the back surface 10B. The second electrode 30 is, for example, an anode electrode. The second electrode 30 is, for example, a metal layer that includes at least one selected from the group consisting of aluminum (Al), titanium (Ti), nickel (Ni), tungsten (W), gold (Au), platinum (Pt), etc.

The third electrode 40 is provided inside a first trench TR1 that is provided in the front surface 10F side of the semiconductor part 10. The third electrode 40 faces the semiconductor part 10 via a first insulating film 45 that covers the inner surface of the first trench TR1. In other words, the first insulating film 45 is provided between the semiconductor part 10 and the third electrode 40. The first insulating film 45 is, for example, a silicon oxide film.

The fourth electrode 50 is provided inside a second trench TR2 which is provided in the front surface 10F side of the semiconductor part 10. The second trench TR2 is provided next to the first trench TR1. The fourth electrode 50 faces the semiconductor part 10 via a second insulating film 55 that covers the inner surface of the second trench TR2. In other words, the second insulating film 55 is provided between the semiconductor part 10 and the fourth electrode 50. The second insulating film 5 is, for example, a silicon oxide film.

The semiconductor part 10 includes a first semiconductor layer 11 of a first conductivity type, a second semiconductor layer 13 of a second conductivity type, a third semiconductor layer 15 of the second conductivity type, a fourth semiconductor layer 17 of the first conductivity type, and a fifth semiconductor layer 19 of the first conductivity type. Hereinbelow, the first conductivity type is described as an n-type, and the second conductivity type is described as a p-type.

The first semiconductor layer 11 is, for example, an n-type low-concentration layer. The first semiconductor layer 11 extends between the first electrode 20 and the second electrode 30.

The second semiconductor layer 13 is, for example, a p-type anode layer. The second semiconductor layer 13 is provided between the first semiconductor layer 11 and the second electrode 30. Also, the second semiconductor layer 13 extends between the third electrode 40 and the fourth electrode 50.

The third semiconductor layer 15 is, for example, a $p^+$-type contact layer. The third semiconductor layer 15 is partially provided on the second semiconductor layer 13 between the second semiconductor layer 13 and the second electrode 30. The third semiconductor layer 15 includes a second-conductivity-type impurity with a higher concentration than the second semiconductor layer 13.

The second electrode 30 is connected to the second and third semiconductor layers 13 and 15 at the front surface 10F of the semiconductor part 10. The second electrode 30 is connected to the second semiconductor layer 13 with, for example, a Schottky contact. The second electrode 30 is connected to the third semiconductor layer 15 with, for example, an ohmic connection. The embodiment is not limited thereto; the second semiconductor layer 13 may has the surface impurity concentration sufficiently low at the interface between the second electrode 30 and the second semiconductor layer 13. In other words, the second electrode 30 is not limited to having a Schottky contact with the second semiconductor layer 13.

The fourth semiconductor layer 17 has n-type conductivity and is provided in the second semiconductor layer 13. The second semiconductor layer 13 includes a portion that extends between the third semiconductor layer 15 and the fourth semiconductor layer 17 and separates the fourth semiconductor layer 17 from the third semiconductor layer 15. Also, the second semiconductor layer 13 includes another portion that extends between the first semiconductor layer 11 and the fourth semiconductor layer 17 and separates the fourth semiconductor layer 17 from the first semiconductor layer 11.

The third semiconductor layer 15 and the fourth semiconductor layer 17 each are provided to contact the first insulating film 45. The third semiconductor layer 15 and the fourth semiconductor layer 17 face the third electrode 40 via the first insulating film 45. The third semiconductor layer 15 is positioned between the fourth semiconductor layer 17 and the second electrode 30.

The semiconductor part 10 further includes second-third semiconductor layer 15 and second-fourth semiconductor layer 17. The second-third semiconductor layer 15 and the second-fourth semiconductor layer 17 each contact the second insulating film 55. The second-third semiconductor layer 15 and the second-fourth semiconductor layer 17 face the fourth electrode 50 via the second insulating film 55.

The second semiconductor layer 13 extends between the fourth semiconductor layer 17 and the second-fourth semiconductor layer 17 and between the third semiconductor layer 15 and the second-third semiconductor layer 15. The second semiconductor layer 13 contacts the second electrode 30 at the front surface 10F of the semiconductor part 10.

The fifth semiconductor layer 19 is, for example, an n-type cathode layer. The fifth semiconductor layer 19 is provided between the first semiconductor layer 11 and the first electrode 20. The fifth semiconductor layer 19 includes a first-conductivity-type impurity with a higher concentration than a concentration of a first-conductivity-type impurity in the first semiconductor layer 11. The first electrode 20 is connected to the fifth semiconductor layer 19 with, for example, an ohmic connection at the back surface 10B side of the semiconductor part 10.

As shown in FIG. 1, the third electrode 40 and the fourth electrode 50 are connected to, for example, the second electrode 30 and have the same potential as a potential of the second electrode 30. The embodiment is not limited to the example; for example, the third electrode 40 and the fourth electrode 50 may be electrically insulated from the second electrode 30 and configured to be supplied with a preferable potential.

In the semiconductor device 1, by providing the fourth semiconductor layer 17 in the second semiconductor layer 13, the flow paths of an electron current Ie flowing from the first semiconductor layer 11 toward the second electrode 30 and a hole current Ih flowing from the second electrode 30 toward the first semiconductor layer 11 can be controlled. For example, when a forward voltage is applied between the first electrode 20 and the second electrode 30, the electron current Ie flows from the first semiconductor layer 11 toward the second electrode 30 via the fourth semiconductor layer 17. The hole current Ih flows to the first semiconductor layer 11 via the third and second semiconductor layers 15 and 13. In other words, the hole current Ih flows from the second electrode 30 to the first semiconductor layer 11 via the third semiconductor layer 15 and an extension part 13*ex* of the second semiconductor layer 13 between the fourth semiconductor layer 17 and the second-fourth semiconductor layer 17.

Thus, by providing the fourth semiconductor layer 17 in the second semiconductor layer 13, the flowing path of the hole current Ih is narrowed, and the hole injection from the second semiconductor layer 13 into the first semiconductor layer 11 is suppressed. That is, the hole injection is suppressed in the turn-off process while transitioning from the on-state to the off-state; therefore, the hole discharge time can be reduced, and the recovery loss (i.e., the switching loss) can be reduced.

Figure 2:
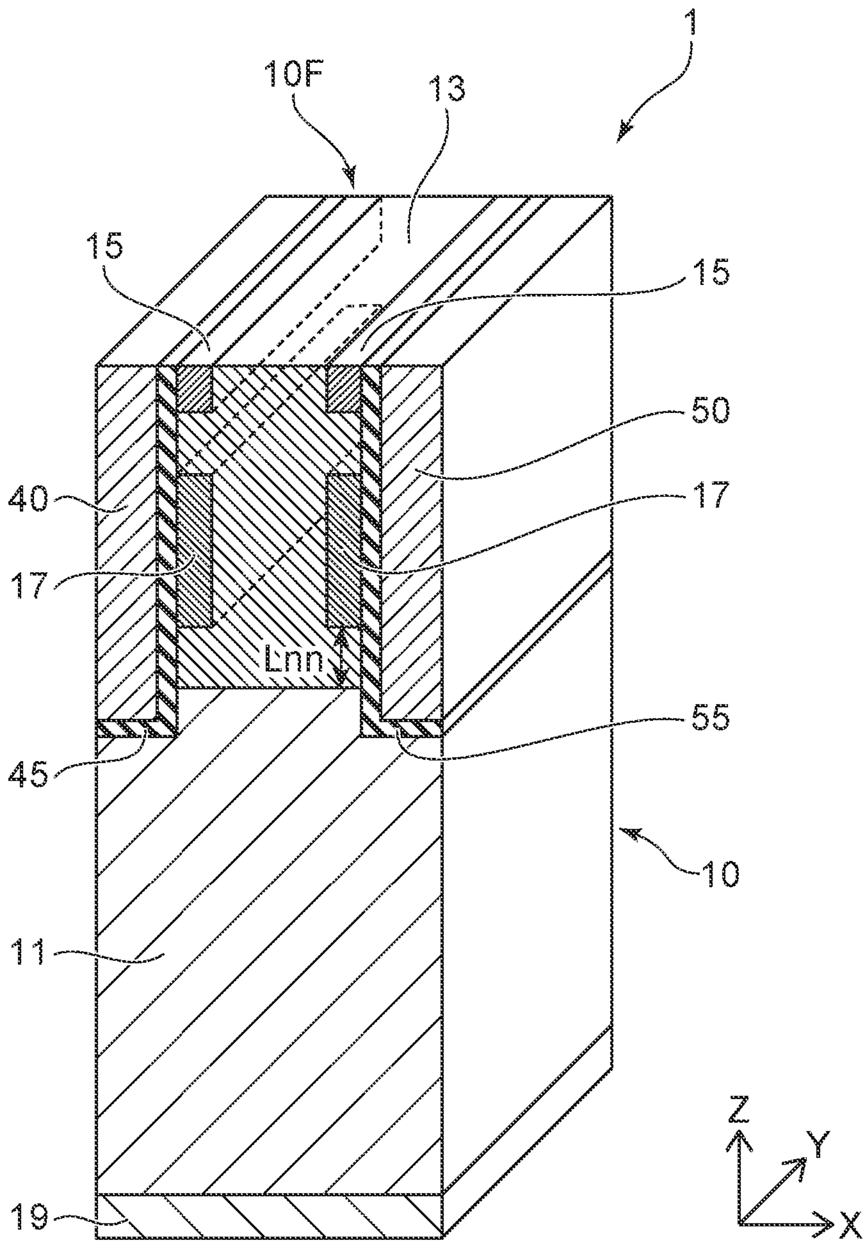
FIG. 2 is a schematic perspective view showing the semiconductor device according to the first embodiment.

FIG. 2 is a schematic perspective view showing the semiconductor device 1 according to the first embodiment. In FIG. 2, the first electrode 20 and the second electrode 30 are not illustrated, and the semiconductor part 10, the third electrode 40, and the fourth electrode 50 are illustrated.

As shown in FIG. 2, the third electrode 40 and the fourth electrode 50 each extend in a direction along the front surface 10F of the semiconductor part 10, e.g., a Y-direction. The third semiconductor layer 15 and the fourth semiconductor layer 17 each extend in the Y-direction along the first insulating film 45. Also, the second-third semiconductor layer 15 and the second-fourth semiconductor layer 17 each extend in the Y-direction along the second insulating film 55.

Figure 3:
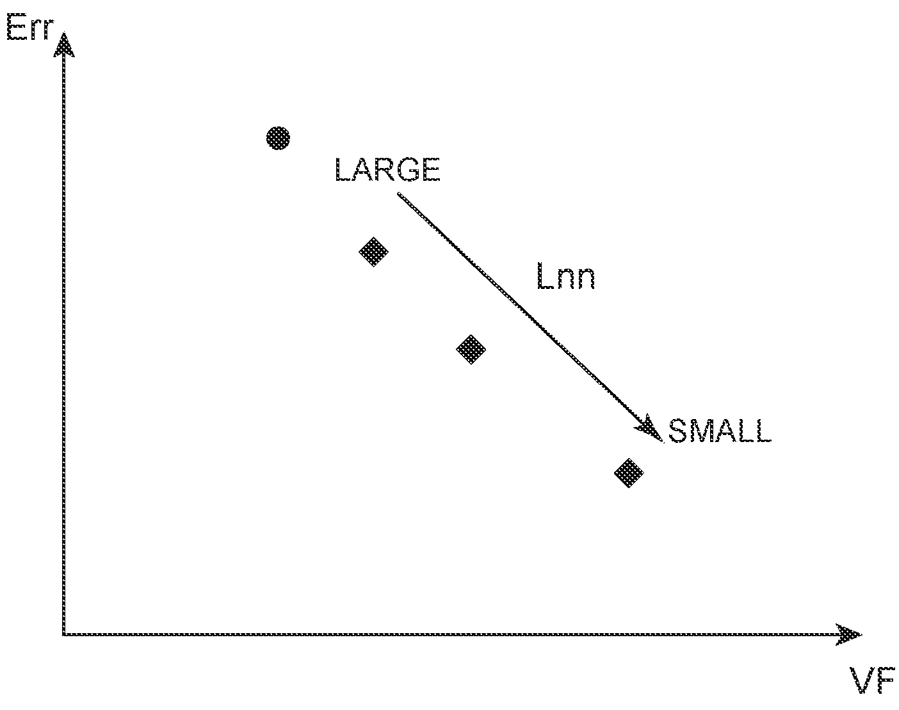
FIG. 3 is a graph showing a characteristic of the semiconductor device 1 according to the first embodiment.

FIG. 3 is a graph showing a characteristic of the semiconductor device 1 according to the first embodiment. The horizontal axis is a forward voltage VF, and the vertical axis is a recovery loss Err.

As shown in FIG. 3, the recovery loss decreases as a distance Lnn in the Z-direction from the first semiconductor layer 11 to the fourth semiconductor layer 17 decreases. In other words, as Lnn decreases, the hole injection from the second and third semiconductor layers 13 and 15 into the first semiconductor layer 11 is suppressed, and the recovery loss is reduced. Thus, it can be said that the recovery loss is reduced by providing the fourth semiconductor layer 17 in the second semiconductor layer 13.

Figure 4A:
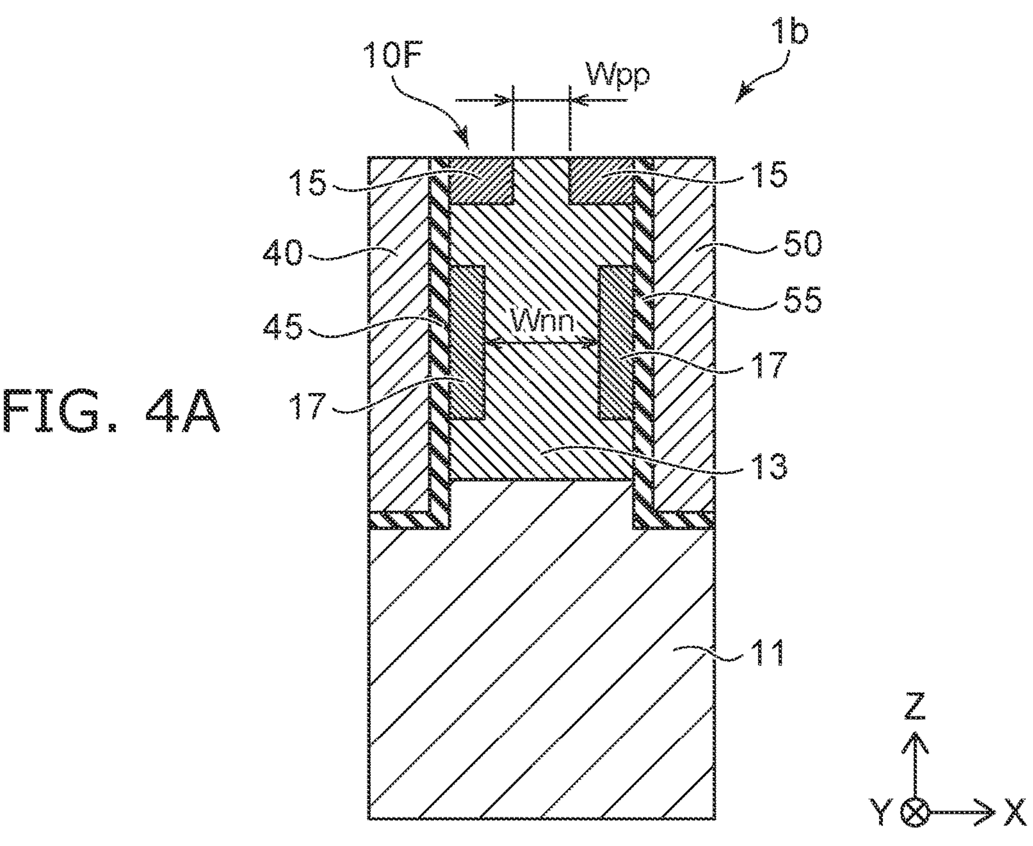
FIGS. 4A and 4B are schematic cross-sectional views showing semiconductor devices according to a first modification of the first embodiment.
Figure 4B:
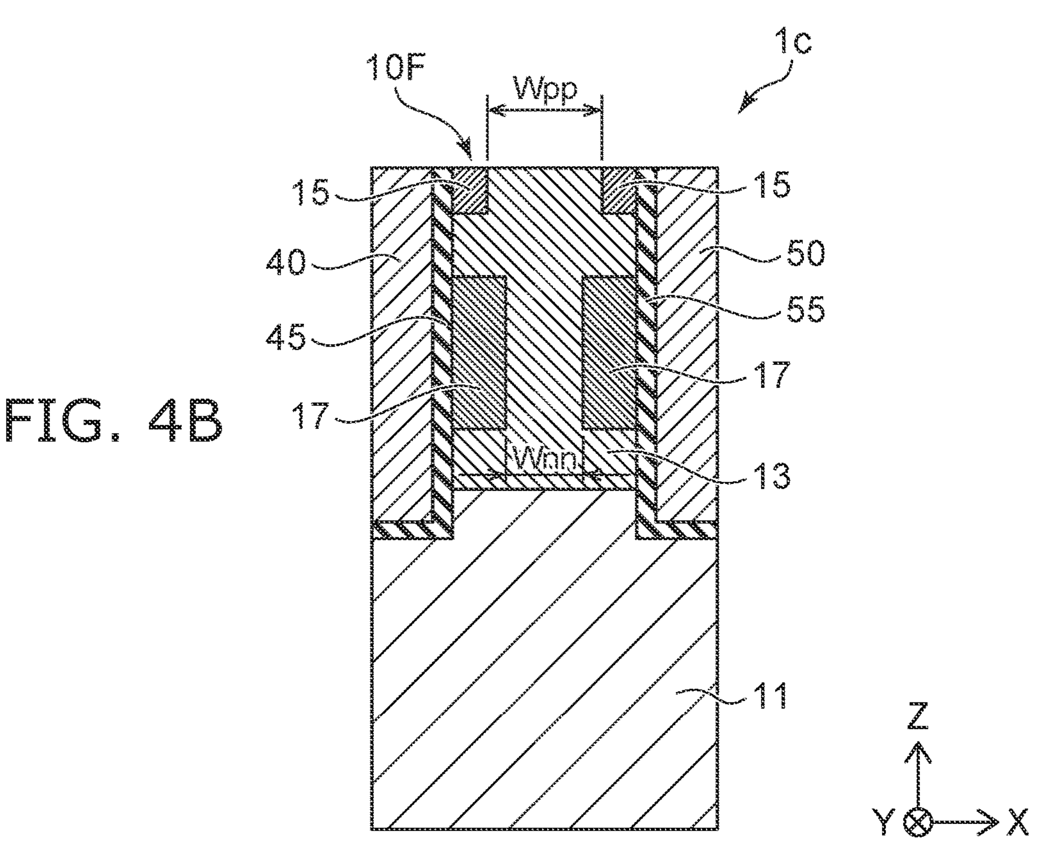

FIGS. 4A and 4B are schematic cross-sectional views showing semiconductor devices 1*b* and 1*c* according to a first modification of the first embodiment. The first electrode 20, the second electrode 30, and the fifth semiconductor layer 19 are not illustrated in FIGS. 4A and 4B.

As shown in FIG. 4A, in the semiconductor device 1*b*, a spacing Wpp between the third semiconductor layer 15 and the second-third semiconductor layer 15 is defined in the direction from the third electrode 40 toward the fourth electrode 50, e.g., the X-direction. Also, a spacing Wnn between the fourth semiconductor layer 17 and the second-fourth semiconductor layer 17 is defined in the X-direction; and the spacing Wpp is less than a spacing Wnn.

Even when the spacing Wpp becomes narrow, for example, due to constraints of the manufacturing processes, etc., the flowing path of the hole current Ih is narrowed by providing the fourth semiconductor layers 17 in the second semiconductor layer 13; and the hole injection from the third and second semiconductor layers 15 and 13 into the first semiconductor layer 11 is suppressed.

As shown in FIG. 4B, the semiconductor device 1*c* also has the spacing Wnn in the X-direction between the fourth semiconductor layer 17 and the second-fourth semiconductor layer 17 and the spacing Wpp in the X-direction between the third semiconductor layer 15 and the second-third semiconductor layer 15. In the example, the spacing Wnn is less than the spacing Wpp. By providing the fourth semiconductor layers 17 in the second semiconductor layer 13, the path of the hole current Ih is narrowed, and the hole injection from the third and second semiconductor layers 15 and 13 into the first semiconductor layer 11 is suppressed. This effect is further increased by reducing the spacing Wnn.

Thus, by preferably providing the spacing Wpp between the third semiconductor layer 15 and the second-third semiconductor layer 15 and the spacing Wnn between the fourth semiconductor layer 17 and the second-fourth semiconductor layer 17, it is possible to control the forward characteristics and the recovery characteristics from the on-state to the off-state.

Figure 5A:
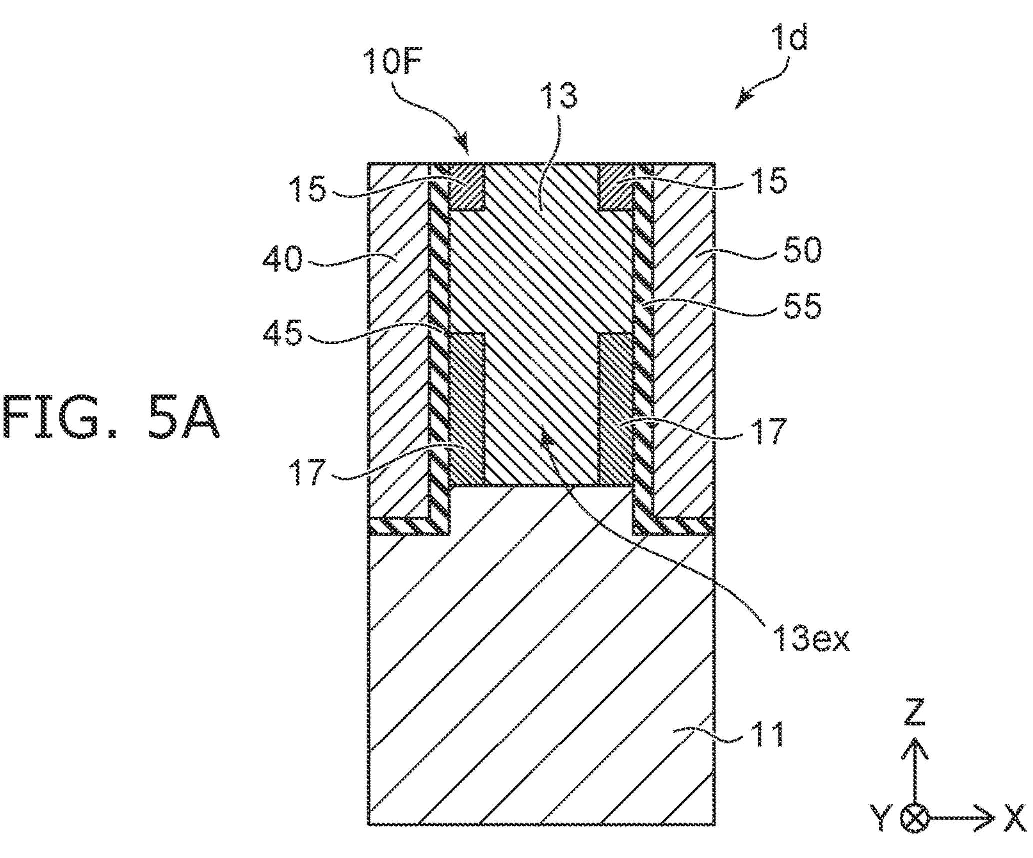
FIGS. 5A and 5B are schematic cross-sectional views showing semiconductor devices according to a second modification of the first embodiment.
Figure 5B:
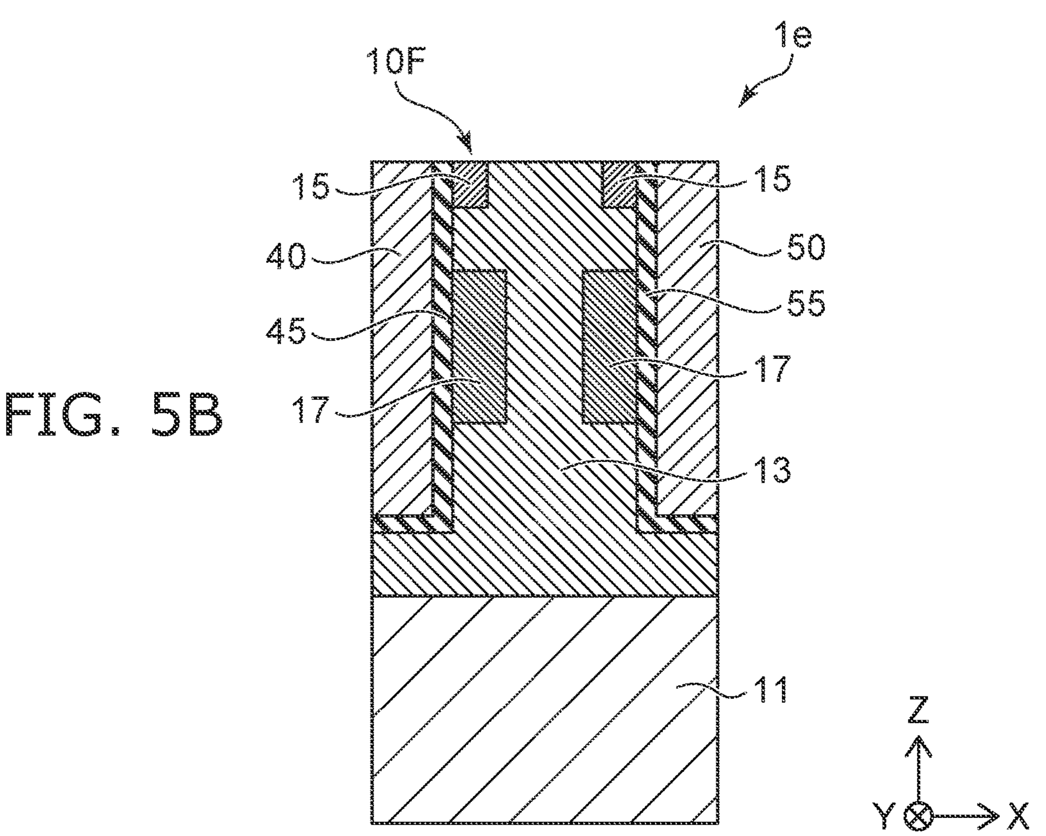

FIGS. 5A and 5B are schematic cross-sectional views showing semiconductor devices 1*d* and 1*e* according to a second modification of the first embodiment. The first electrode 20, the second electrode 30, and the fifth semiconductor layer 19 are not illustrated in FIGS. 5A and 5B (see FIG. 1).

As shown in FIG. 5A, the semiconductor device 1*d* includes the fourth semiconductor layers 17 contacting the first semiconductor layer 11. The fourth semiconductor layer 17 contacts the first insulating film 45; and the second-fourth semiconductor layer 17 contacts the second insulating film 55. The second semiconductor layer 13 includes the extension part 13*ex* that extends between the fourth semiconductor layer 17 and the second-fourth semiconductor layer 17. The extension part 13*ex* of the second semiconductor layer 13 contacts the first semiconductor layer 11 between the fourth semiconductor layer 17 and the second-fourth semiconductor layer 17.

As shown in FIG. 5B, the semiconductor device 1*e* includes the third electrode 40 and the fourth electrode 50 that are provided in the second semiconductor layer 13. The first insulating film 45 is provided between the second semiconductor layer 13 and the third electrode 40. The second insulating film 55 is provided between the second semiconductor layer 13 and the fourth electrode 50. The second semiconductor layer 13 extends between the first semiconductor layer 11 and the third electrode 40 and between the first semiconductor layer 11 and the fourth electrode 50.

Figure 6:
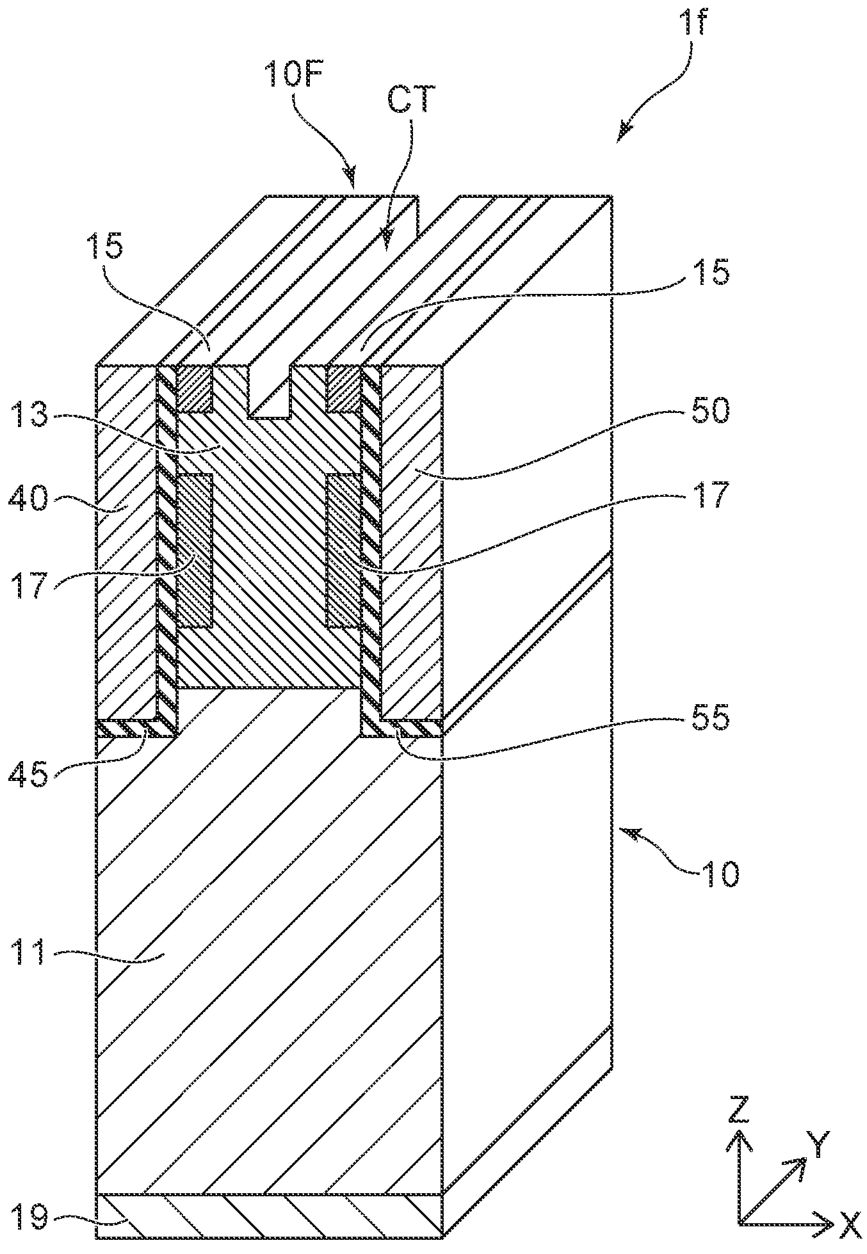
FIG. 6 is a schematic perspective view showing a semiconductor device according to a third modification of the first embodiment.

FIG. 6 is a schematic perspective view showing a semiconductor device if according to a third modification of the first embodiment. In FIG. 6, the first electrode 20 and the second electrode 30 are not illustrated, and the semiconductor part 10, the third electrode 40, and the fourth electrode 50 are illustrated.

The semiconductor device if includes a contact trench CT. The contact trench CT is provided between the third semiconductor layer 15 and the second-third semiconductor layer 15. The second electrode 30 (see FIG. 1) is provided to fill the interior of the contact trench CT.

The contact trench CT is provided in the second semiconductor layer 13 between the third semiconductor layer 15 and the second-third semiconductor layer 15. The contact trench CT extends in, for example, the Y-direction along the extension direction of the third semiconductor layer 15.

The second electrode 30 contacts the second and third semiconductor layers 13 and 15 at the front surface 10F of the semiconductor part 10 and contacts the second semiconductor layer 13 at the inner surface of the contact trench CT. The contact area between the second electrode 30 and the second semiconductor layer 13 can be increased thereby. Furthermore, the contact part between the second electrode 30 and the second semiconductor layer 13 is provided at a deeper position than the front surface 10F of the semiconductor part 10. By including such a contact part, it is possible to suppress the amount of the holes injected from the second electrode 30 into the second semiconductor layer 13 via the second semiconductor layer 13.

Figure 7:
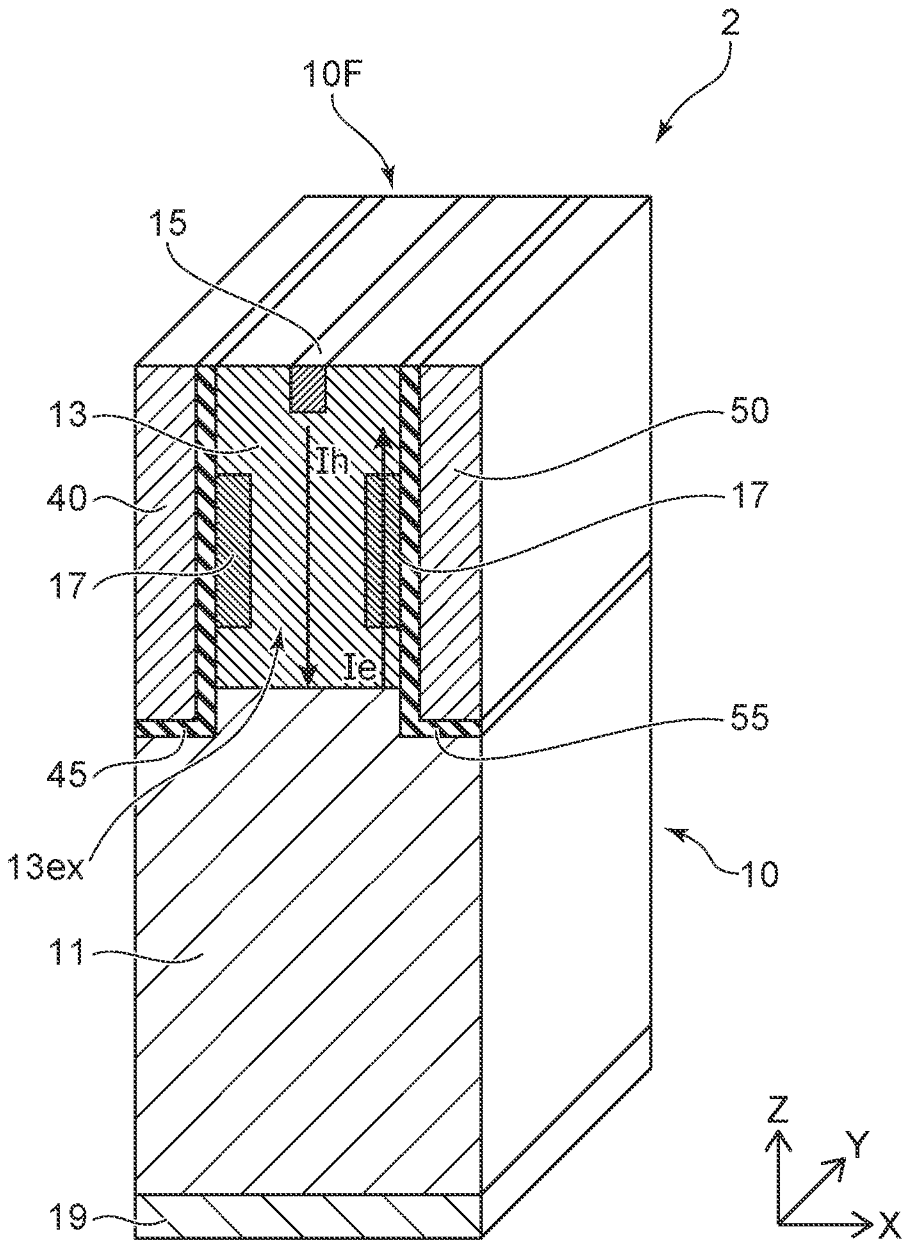
FIG. 7 is a schematic perspective view showing a semiconductor device according to a fourth modification of the first embodiment.

FIG. 7 is a schematic perspective view showing a semiconductor device 2 according to a fourth modification of the first embodiment. In FIG. 7, the first electrode 20 and the second electrode 30 are not illustrated, and the semiconductor part 10, the third electrode 40, and the fourth electrode 50 are illustrated.

In the example, the third semiconductor layer 15 is provided at a position apart from the first and second insulating films 45 and 55. The second semiconductor layer 13 extends between the third semiconductor layer 15 and the first insulating film 45 and between the third semiconductor layer 15 and the second insulating film 55.

The fourth semiconductor layer 17 contacts the first insulating film 45; and the second-fourth semiconductor layer 17 contacts the second insulating film 55. The second semiconductor layer 13 includes the extension part 13*ex* extending between the fourth semiconductor layer 17 and the second-fourth semiconductor layer 17.

As shown in FIG. 7, the third semiconductor layer 15 is not provided between the fourth semiconductor layer 17 and the second electrode 30 (see FIG. 1). The fourth semiconductor layer 17 is not provided between the first semiconductor layer 11 and the third semiconductor layer 15.

The electron current Ie flows from the first semiconductor layer 11 via the fourth semiconductor layer 17 toward the second electrode 30 partially contacting the second semiconductor layer 13. The hole current Ih flows from the third semiconductor layer 15 toward the first semiconductor layer 11 via the extension part 13*ex* of the second semiconductor layer 13 between the fourth semiconductor layer 17 and the second-fourth semiconductor layer 17.

Figure 8:
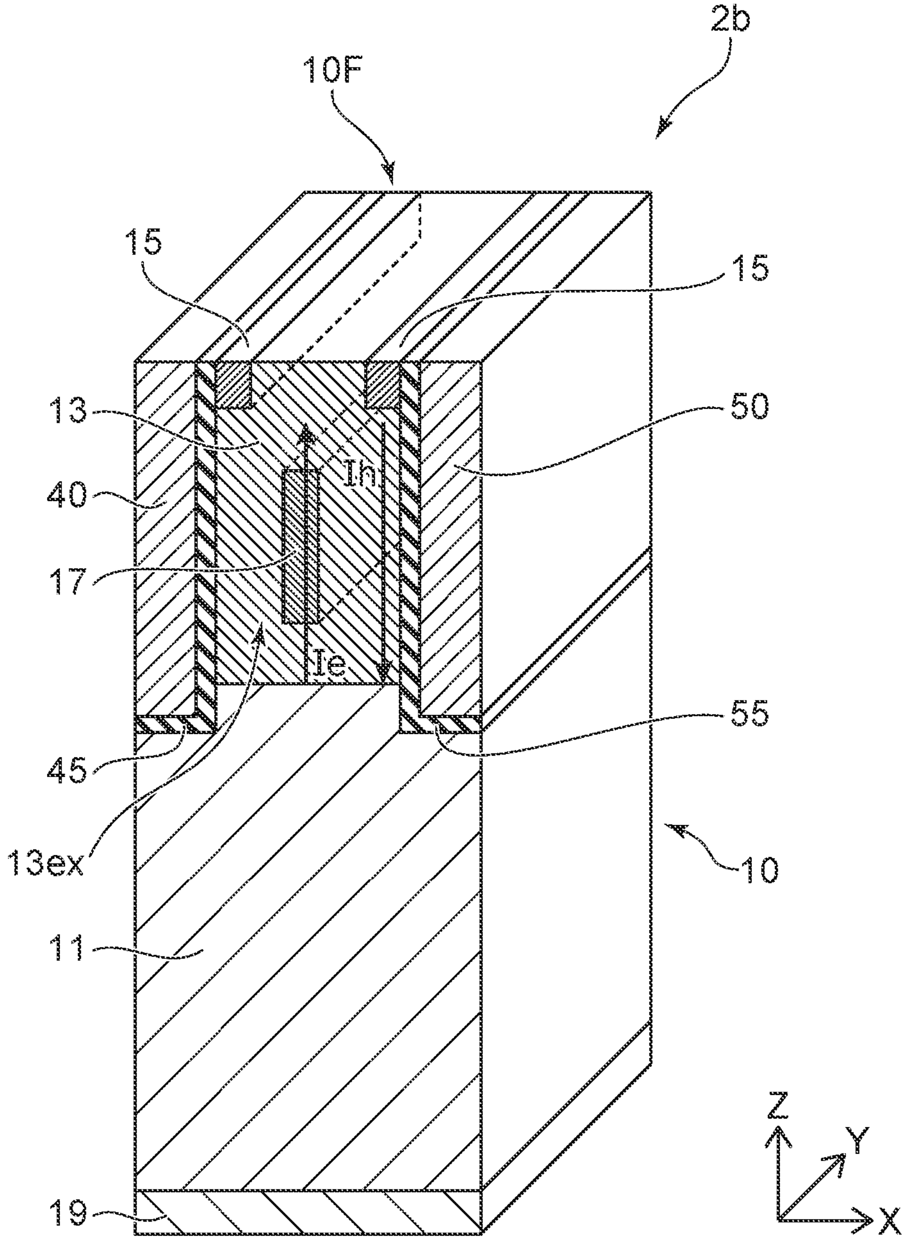
FIG. 8 is a schematic perspective view showing a semiconductor device according to a fifth modification of the first embodiment.

FIG. 8 is a schematic perspective view showing a semiconductor device 2*b* according to a fifth modification of the first embodiment. In FIG. 8, the first electrode 20 and the second electrode 30 are not illustrated, and the semiconductor part 10, the third electrode 40, and the fourth electrode 50 are illustrated.

In the example, the fourth semiconductor layer 17 is apart from the first and second insulating films 45 and 55. The second semiconductor layer 13 extends between the fourth semiconductor layer 17 and the first insulating film 45 and between the fourth semiconductor layer 17 and the second insulating film 55.

The third semiconductor layer 15 contacts the first insulating film 45; and the second-third semiconductor layer 15 contacts the second insulating film 55. The third semiconductor layer 15 is not provided between the fourth semiconductor layer 17 and the second electrode 30 (see FIG. 1). The fourth semiconductor layer 17 is not provided between the first semiconductor layer 11 and the third semiconductor layer 15.

The electron current Ie flows from the first semiconductor layer 11 to the second electrode 30 via the fourth semiconductor layer 17. The second electrode includes a contact region that contacts the second semiconductor layer 13 between the third semiconductor layer 15 and the second third semiconductor layer 15. The electron current Ie flows toward the contact region of the second electrode 30 via the fourth semiconductor layer 17. The hole current Ih flows from the third semiconductor layer 15 toward the first semiconductor layer 11 via the extension part 13*ex* of the second semiconductor layer 13. In the example, a pair of the extension parts 13*ex* are provided respectively between the fourth semiconductor layer 17 and the first insulating film 45 and between the fourth semiconductor layer 17 and the second insulating film 55.

Figure 9:
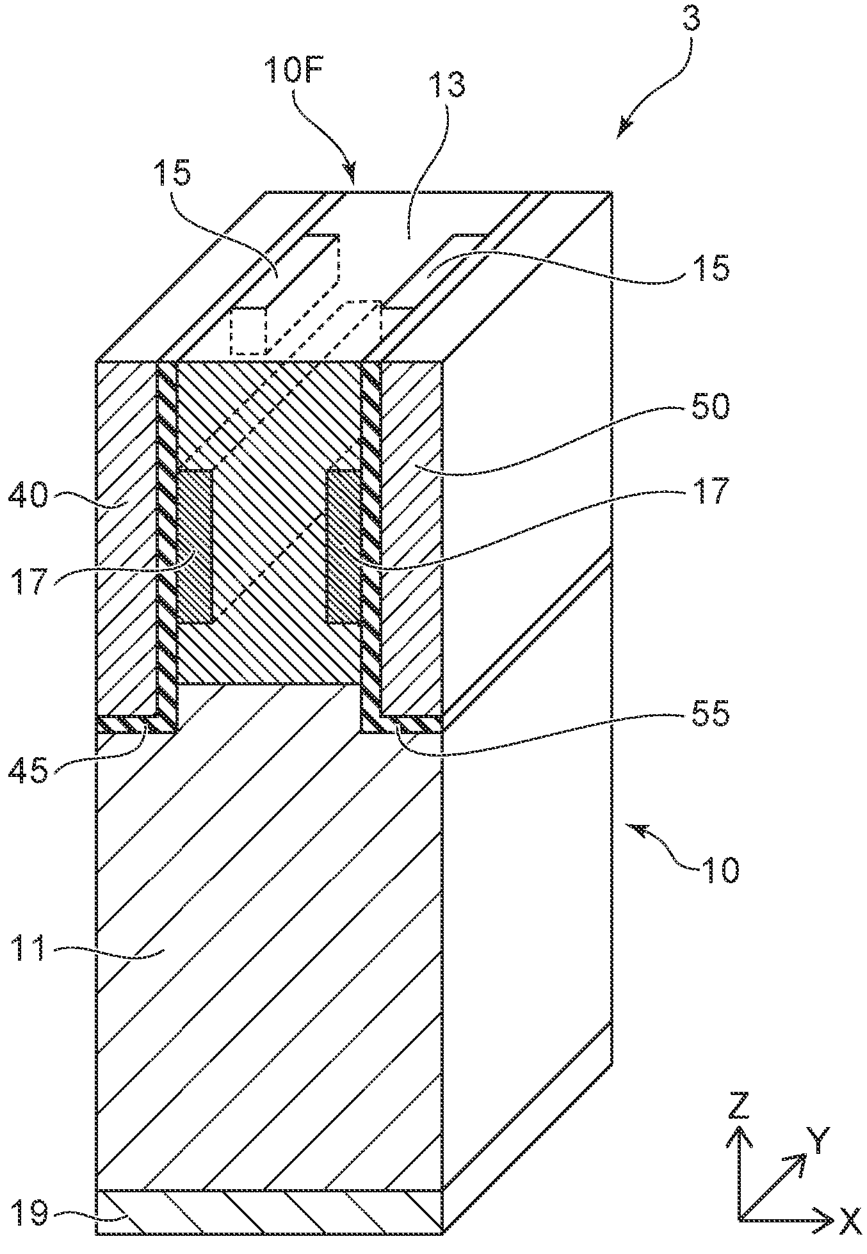
FIG. 9 is a schematic perspective view showing a semiconductor device according to a sixth modification of the first embodiment.

FIG. 9 is a schematic perspective view showing a semiconductor device 3 according to a sixth modification of the first embodiment. In FIG. 9, the first electrode 20 and the second electrode 30 are not illustrated, and the semiconductor part 10, the third electrode 40, and the fourth electrode 50 are illustrated.

Figures 10A, 10B:
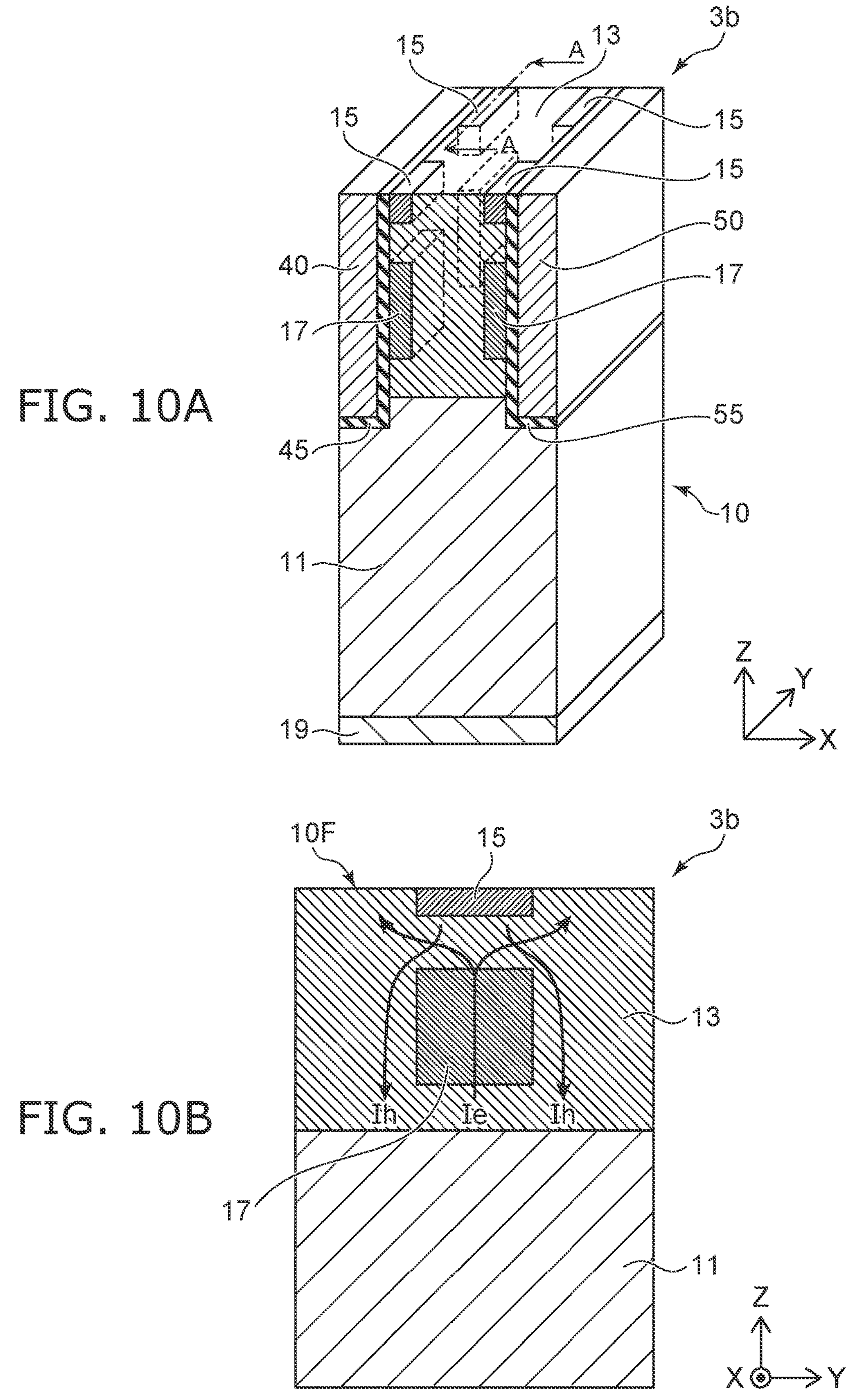
FIGS. 10A and 10B are schematic views showing a semiconductor device according to a seventh modification of the first embodiment.

In the example, the third semiconductor layer 15 includes multiple parts apart from each other in the extension direction of the third electrode 40, e.g., the Y-direction (see FIG. 10A). The multiple parts of the third semiconductor layer 15 each contact the first insulating film 45. The second-third semiconductor layer 15 also includes multiple parts apart from each other that are in contact with the second insulating film 55. The fourth semiconductor layer 17 is provided between the first semiconductor layer 11 and the third semiconductor layer 15. The fourth semiconductor layer 17 contacts the first insulating film 45 or the second insulating film 55 and extends in the Y-direction. The second semiconductor layer 13 extends between the third semiconductor layer 15 and the second-third semiconductor layer 15 and between the fourth semiconductor layer 17 and the second-fourth semiconductor layer 17.

FIGS. 10A and 10B are schematic views showing a semiconductor device 3*b* according to a seventh modification of the first embodiment. In FIG. 10A, the first electrode 20 and the second electrode 30 are not illustrated, and the semiconductor part 10, the third electrode 40, and the fourth electrode 50 are illustrated. FIG. 10B is a cross-sectional view along line A-A shown in FIG. 10A.

Also, in the example, the third semiconductor layer 15 includes multiple parts apart from each other in the Y-direction. The multiple parts of the third semiconductor layer 15 each contact the first insulating film 45. The second-third semiconductor layer 15 also includes multiple parts apart from each other in the Y-direction. The multiple parts of the second-third semiconductor layer 15 each contact the second insulating film 55.

The fourth semiconductor layer 17 includes multiple parts apart from each other in the Y-direction. The multiple parts of the fourth semiconductor layer 17 each contact the first also includes multiple parts apart from each other in the Y-direction. The multiple parts of the second-fourth semiconductor layer 17 each contact the second insulating film 5.

The second semiconductor layer 13 extends between the third semiconductor layer 15 and the second-third semiconductor layer 15 and between the fourth semiconductor layer 17 and the second-fourth semiconductor layer 17.

As shown in FIG. 10B, the fourth semiconductor layer 17 is positioned in the second semiconductor layer 13 between the first semiconductor layer 11 and the third semiconductor layer 15. The electron current Ie flows from the first semiconductor layer 11 via the fourth semiconductor layer 17 toward the second electrode 30 (see FIG. 1) partially contacting the second semiconductor layer 13. The hole current Ih flows from the third semiconductor layer 15 toward the first semiconductor layer 11 via the second semiconductor layer 13.

Figures 11A, 11B:
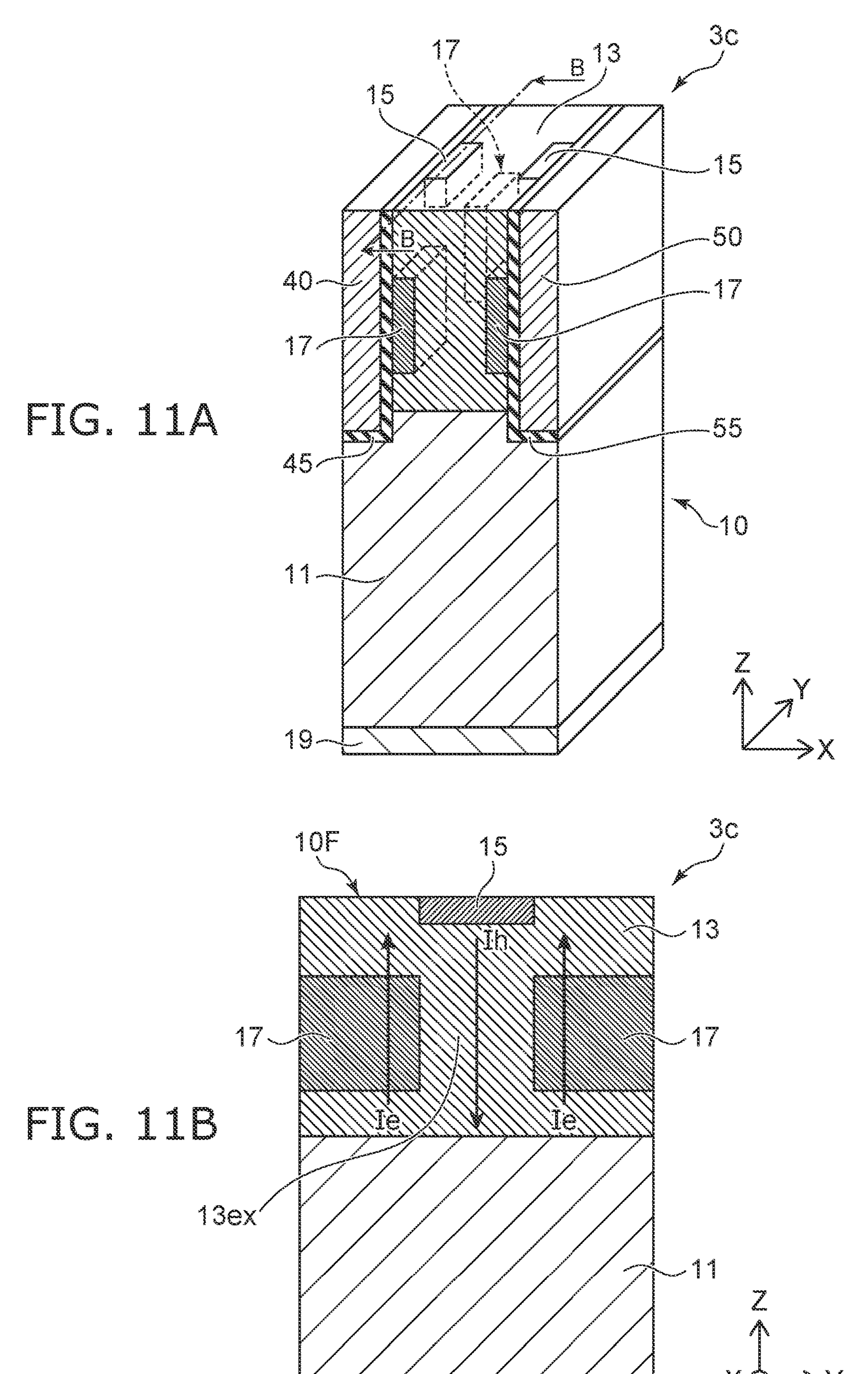
FIGS. 11A and 11B are schematic views showing a semiconductor device according to an eighth modification of the first embodiment.

FIGS. 11A and 11B are schematic views showing a semiconductor device 3*c* according to an eighth modification of the first embodiment. In FIG. 11A, the first electrode 20 and the second electrode 30 are not illustrated, and the semiconductor part 10, the third electrode 40, and the fourth electrode 50 are illustrated. FIG. 11B is a cross-sectional view along line B-B shown in FIG. 11A.

The third semiconductor layer 15 shown in FIG. 11A includes multiple parts apart from each other in the Y-direction (see FIG. 10A). The multiple parts of the third semiconductor layer 15 each contact the first insulating film 45. The second-third semiconductor layer 15 also includes multiple parts apart from each other in the Y-direction. The multiple parts of the second-third semiconductor layer 15 each contact the second insulating film 55.

The fourth semiconductor layer 17 includes multiple parts apart from each other in the Y-direction. The multiple parts of the fourth semiconductor layer 17 each contact the first also includes multiple parts apart from each other in the Y-direction. The multiple parts of the second-fourth semiconductor layer 17 each contact the second insulating film 5.

The second semiconductor layer 13 extends between the third semiconductor layer 15 and the second-third semiconductor layer 15 and between the fourth semiconductor layer 17 and the second-fourth semiconductor layer 17.

As shown in FIG. 11B, the fourth semiconductor layer 17 includes parts next to each other in the Y-direction. The second semiconductor layer 13 includes the extension part 13*ex* that extends between the adjacent parts of the fourth semiconductor layer 17. The third semiconductor layer 15 faces the first semiconductor layer 11 via the extension part 13*ex* of the second semiconductor layer 13.

The electron current Ie flows from the first semiconductor layer 11 via the fourth semiconductor layer 17 to the contact region at which the second electrode 30 and the second semiconductor layer 13 contact. The hole current Ih flows from the third semiconductor layer 15 toward the first semiconductor layer 11 via the extension part 13*ex* of the second semiconductor layer 13.

Second Embodiment

Figures 12A, 12B:
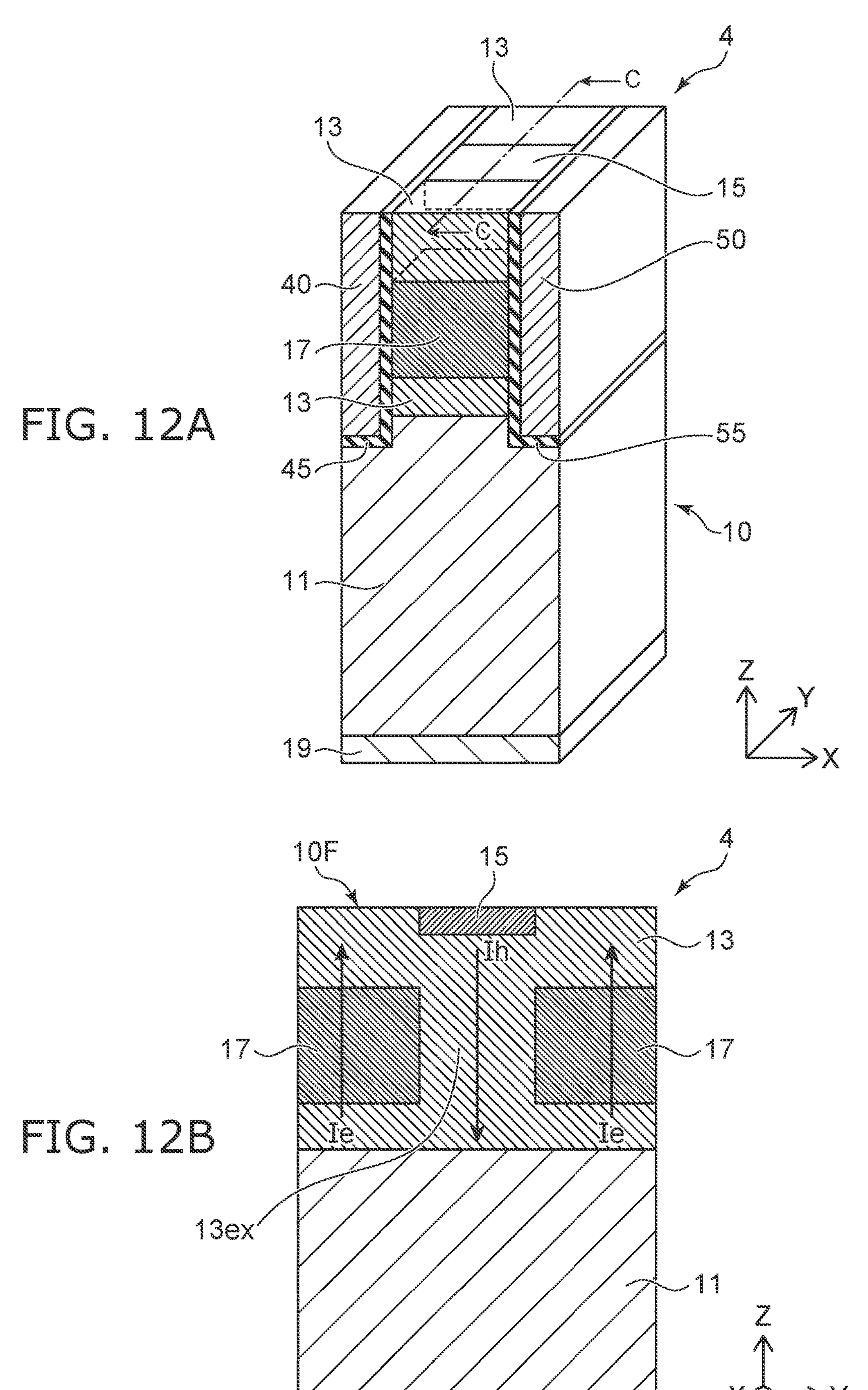
FIGS. 12A and 12B are schematic views showing a semiconductor device according to a second embodiment.

FIGS. 12A and 12B are schematic views showing a semiconductor device 4 according to a second embodiment. In FIG. 12A, the first electrode 20 and the second electrode 30 are not illustrated, and the semiconductor part 10, the third electrode 40, and the fourth electrode 50 are illustrated. FIG. 12B is a cross-sectional view along line C-C shown in FIG. 12A.

As shown in FIG. 12A, the third semiconductor layer 15 of the semiconductor device 4 extends in the direction from the third electrode 40 toward the fourth electrode 50, e.g., the X-direction, and contacts the first and second insulating films 45 and 55. The fourth semiconductor layer 17 also extends in the X-direction and contacts the first and second insulating films 45 and 55.

In the example, Multiple fourth semiconductor layers 17 are provided. The fourth semiconductor layers 17 are arranged in, for example, the Y-direction in the extension direction of the third and fourth electrodes 40 and 50. The fourth semiconductor layers 17 are arranged in the Y-direction and apart from each other.

As shown in FIG. 12B, the second semiconductor layer 13 includes the extension part 13*ex* extending between the fourth semiconductor layers 17 that are next to each other in the Y-direction. The third semiconductor layer 15 faces the first semiconductor layer 11 via the extension part 13*ex* of the second semiconductor layer 13.

The electron current Ie flows from the first semiconductor layer 11 via the fourth semiconductor layer 17 to the contact region of the second semiconductor layer 13 at which the second electrode 30 partially contacts the second semiconductor layer 13. The hole current Ih flows from the third semiconductor layer 15 toward the first semiconductor layer 11 via the extension part 13*ex* of the second semiconductor layer 13.

Figure 13A:
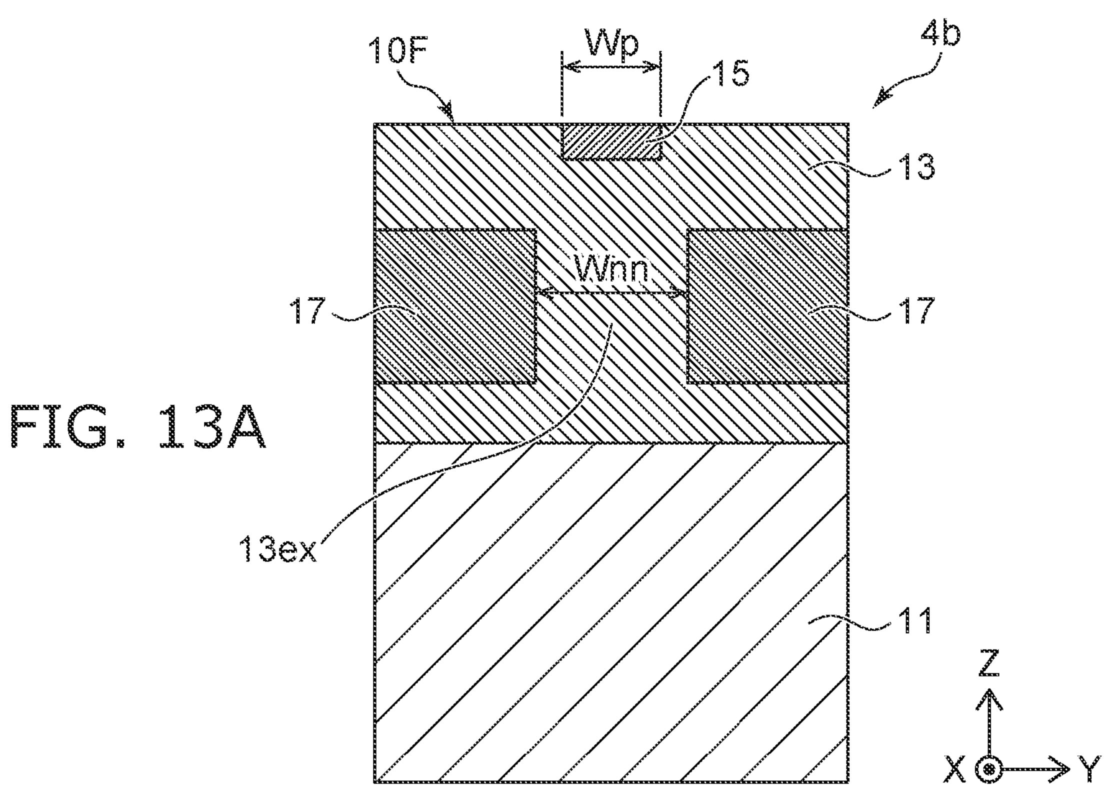
FIGS. 13A and 13B are schematic cross-sectional views showing semiconductor devices according to a first modification of the second embodiment.
Figure 13B:
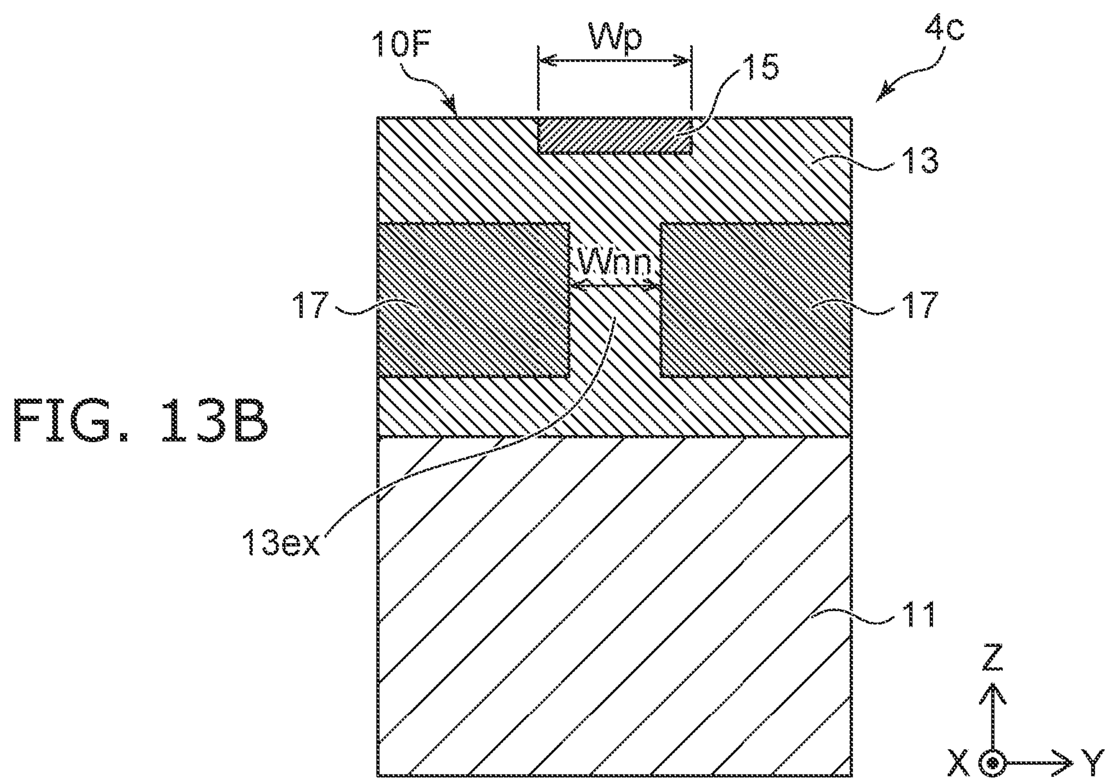

FIGS. 13A and 13B are schematic cross-sectional views showing semiconductor devices 4*b* and 4*c* according to a first modification of the second embodiment. The first electrode 20, the second electrode 30, and the fifth semiconductor layer 19 are not illustrated in FIGS. 13A and 13B.

As shown in FIG. 13A, for example, the spacing Wnn between the fourth semiconductor layers 17 next to each other in the Y-direction is greater than a width Wp in the Y-direction of the third semiconductor layer 15.

As shown in FIG. 13B, the spacing Wnn between the fourth semiconductor layers 17 next to each other in the Y-direction may be less than the width Wp in the Y-direction of the third semiconductor layer 15.

Also, in these examples, by providing the fourth semiconductor layer 17 in the second semiconductor layer 13, the hole injection from the second semiconductor layer 13 into the first semiconductor layer 11 can be suppressed, and the recovery loss can be reduced.

Figures 14A, 14B:
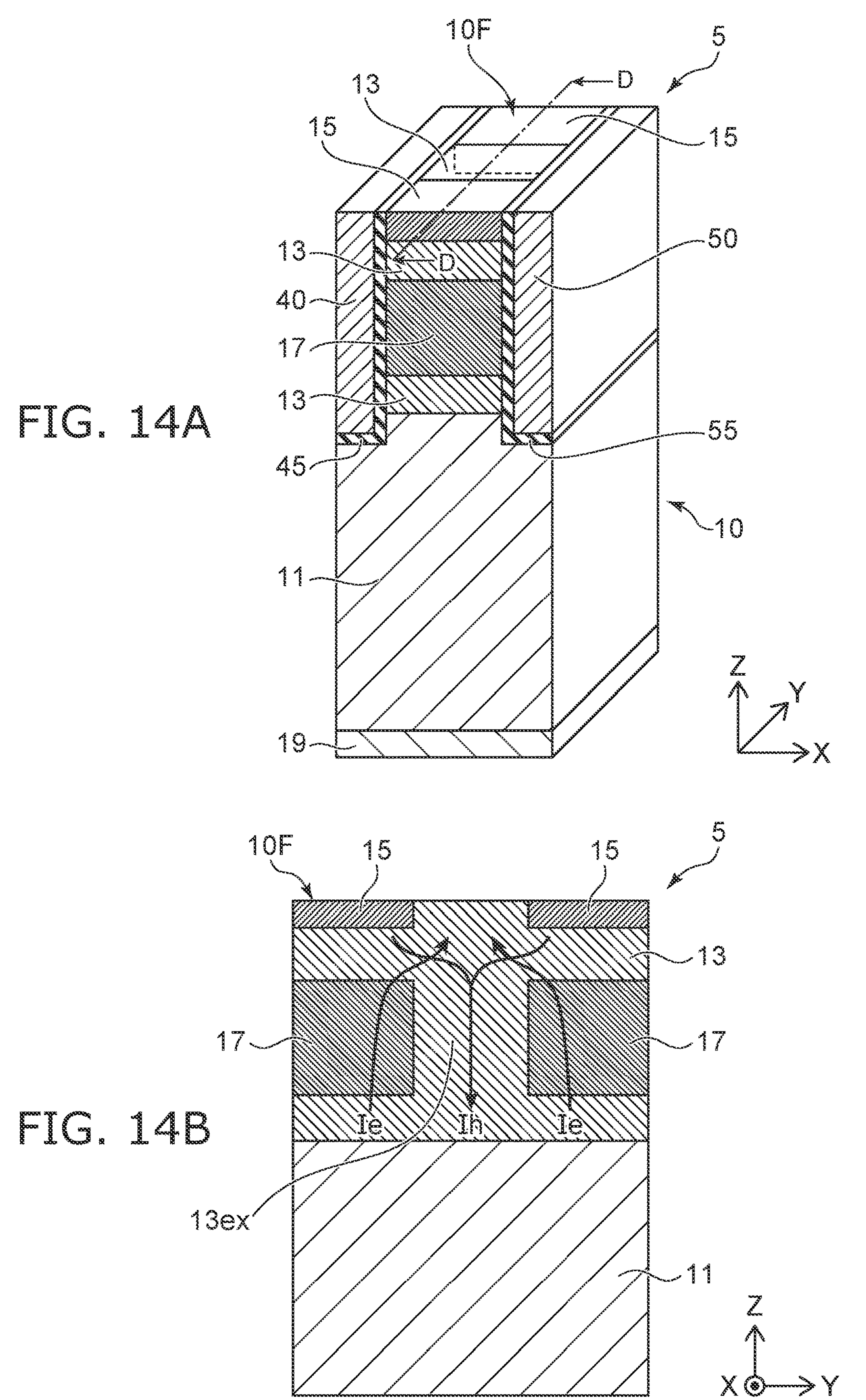
FIGS. 14A and 14B are schematic views showing a semiconductor device 5 according to a second modification of the second embodiment.

FIGS. 14A and 14B are schematic views showing a semiconductor device 5 according to a second modification of the second embodiment. In FIG. 14A, the first electrode 20 and the second electrode 30 are not illustrated, and the semiconductor part 10, the third electrode 40, and the fourth electrode 50 are illustrated. FIG. 14B is a cross-sectional view along line D-D shown in FIG. 14A.

As shown in FIG. 14A, the third semiconductor layer 15 extends in the direction from the third electrode 40 toward the fourth electrode 50, e.g., the X-direction, and contacts the first and second insulating films 45 and 55. The fourth semiconductor layer 17 also extends in the X-direction and contacts the first and second insulating films 45 and 55.

In the example, multiple third semiconductor layers 15 and multiple fourth semiconductor layers 17 are provided. The third semiconductor layers 15 and the fourth semiconductor layers 17 are arranged in the extension direction of the third and fourth electrodes 40 and 50, e.g., the Y-direction. The fourth semiconductor layers 17 are positioned between the first semiconductor layer 11 and the third semiconductor layers 15.

As shown in FIG. 14B, the second semiconductor layer 13 extends between the third semiconductor layers 15 next to each other in the Y-direction and between the fourth semiconductor layers 17 next to each other in the Y-direction. The electron current Ie flows from the first semiconductor layer 11 via the fourth semiconductor layer 17 to the contact region of the second semiconductor layer 13 at which the second electrode 30 (see FIG. 1) contacts the second semiconductor layer 13. On the other hand, the hole current Ih flows from the third semiconductor layer 15 toward the first semiconductor layer 11 via the extension part 13*ex* of the second semiconductor layer 13 extending between the adjacent fourth semiconductor layers 17.

Figure 15A:
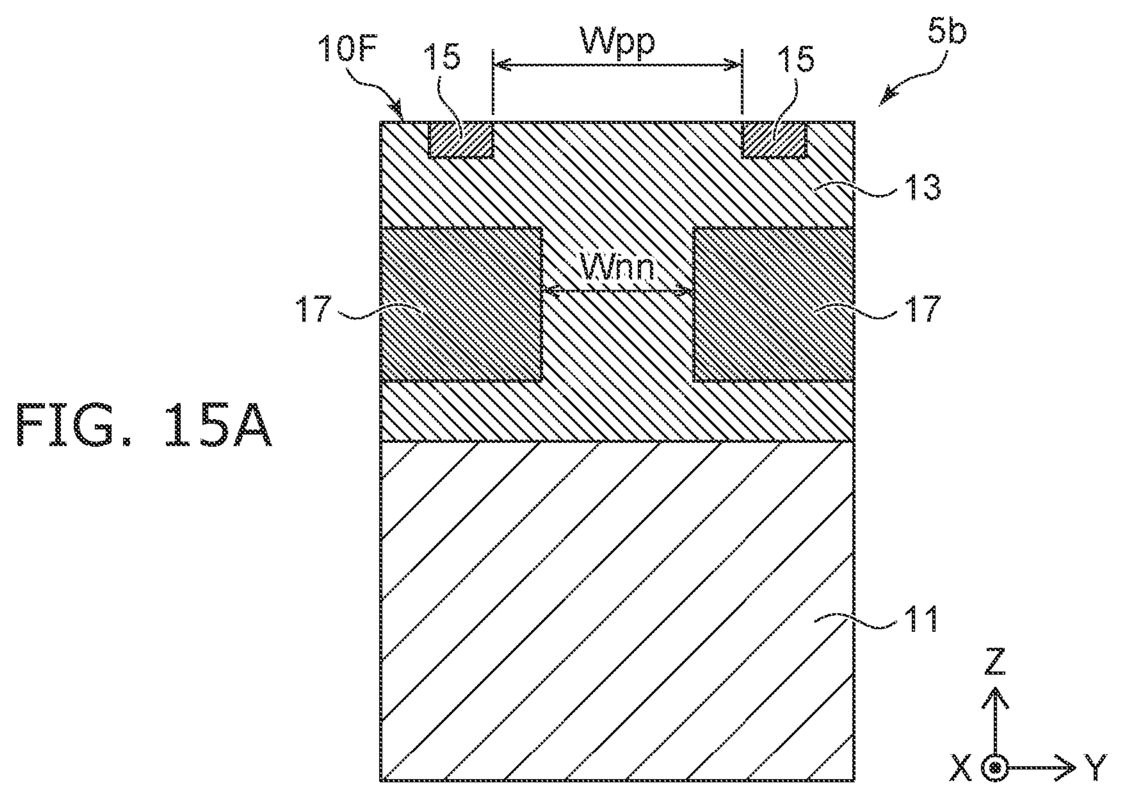
FIGS. 15A and 15B are schematic cross-sectional views showing semiconductor devices according to a third modification of the second embodiment.
Figure 15B:
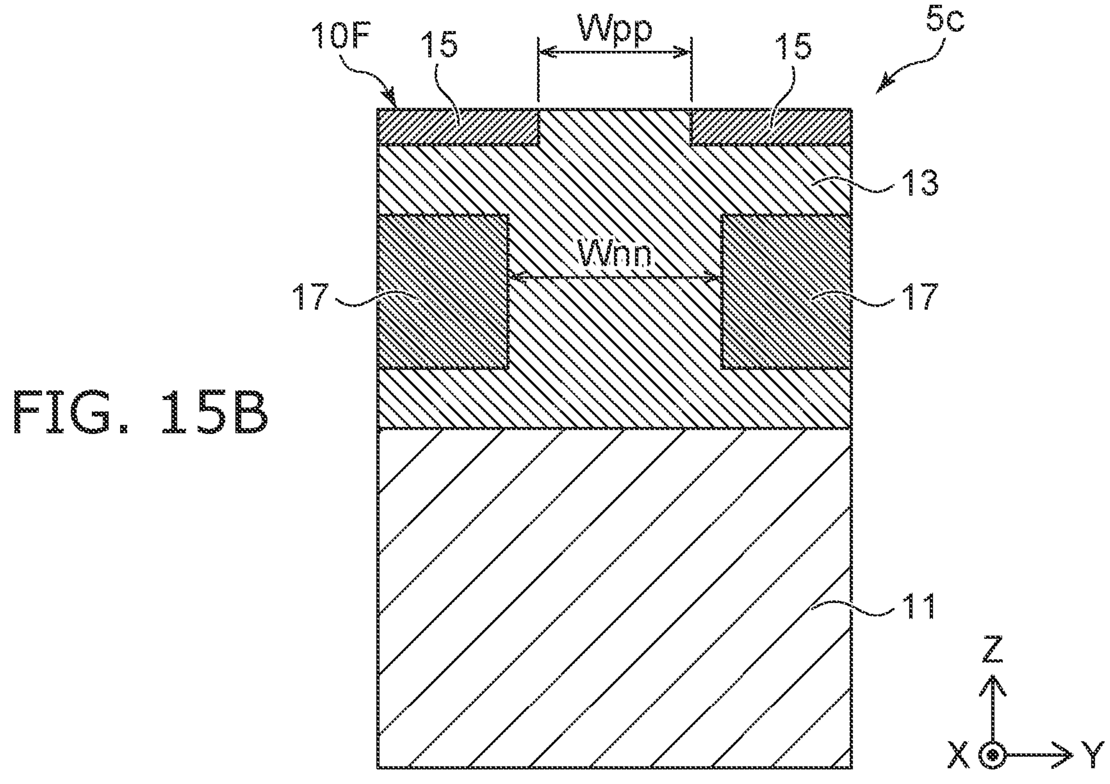

FIGS. 15A and 15B are schematic cross-sectional views showing semiconductor devices 5*b* and 5*c* according to a third modification of the second embodiment. The first electrode 20, the second electrode 30, and the fifth semiconductor layer 19 are not illustrated in FIGS. 15A and 15B.

As shown in FIG. 15A, the spacing Wnn between the fourth semiconductor layers 17 next to each other in the Y-direction is less than the spacing Wpp between the third semiconductor layers 15 next to each other in the Y-direction. By providing the fourth semiconductor layer 17 in the second semiconductor layer 13, the flowing path of the hole current Ih is narrowed, and the hole injection from the third and second semiconductor layers 15 and 13 into the first semiconductor layer 11 is suppressed. This effect is further increased by reducing the spacing Wnn.

As shown in FIG. 15B, the spacing Wpp between the third semiconductor layers 15 next to each other in the Y-direction may be less than the spacing Wnn between the fourth semiconductor layers 17 next to each other in the Y-direction. For example, by providing the fourth semiconductor layer 17 in the second semiconductor layer 13, even when the spacing Wpp becomes narrow due to constraints of the manufacturing processes, etc., the flowing path of the hole current Ih is narrowed, and the hole injection from the third and second semiconductor layers 15 and 13 into the first semiconductor layer 11 is suppressed.

Also, in these examples, by providing the fourth semiconductor layer 17 in the second semiconductor layer 13, the hole injection from the second semiconductor layer 13 into the first semiconductor layer 11 can be suppressed, and the recovery loss can be reduced.

Third Embodiment

Figure 16:
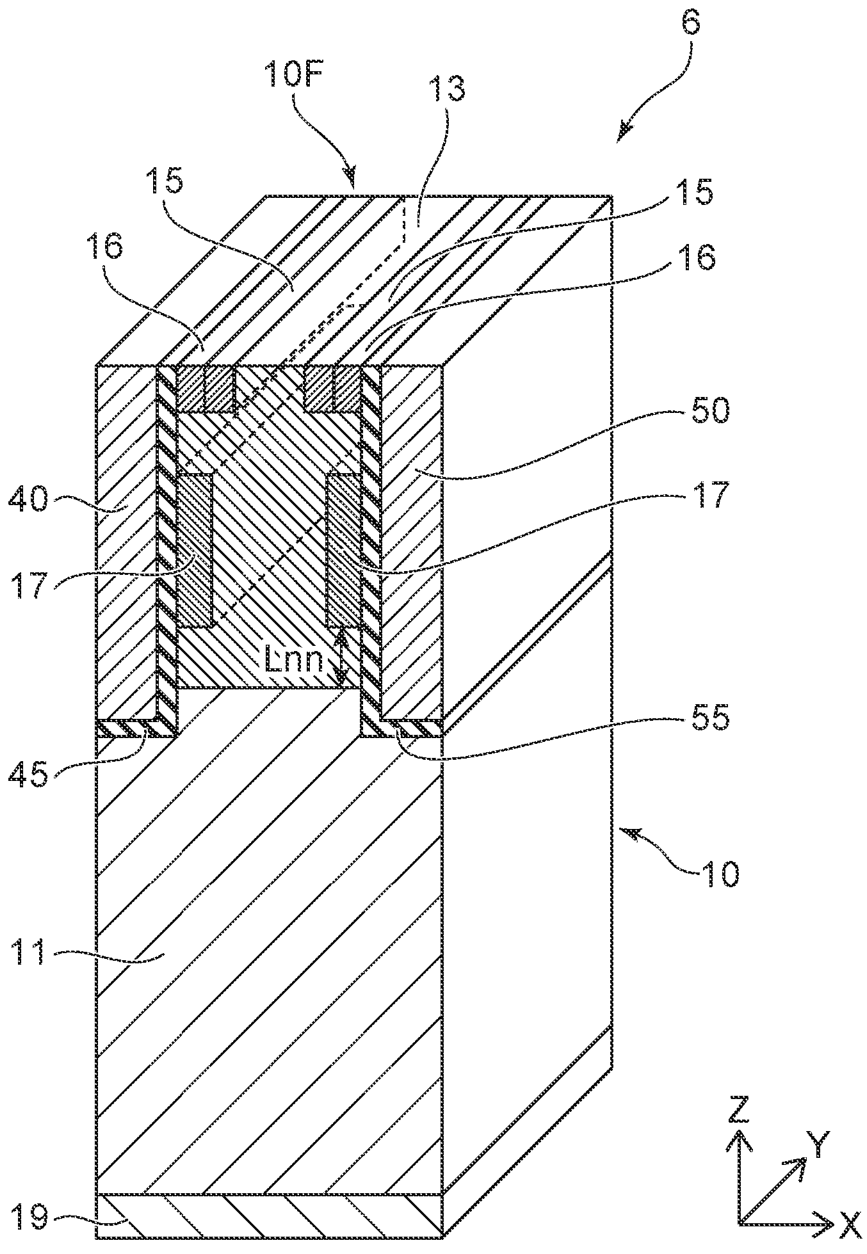
FIG. 16 is a schematic perspective view showing a semiconductor device 6 according to a third embodiment.

FIG. 16 is a schematic perspective view showing a semiconductor device 6 according to a third embodiment. In FIG. 16, the first electrode 20 and the second electrode 30 (see FIG. 1) are not illustrated, and the semiconductor part 10, the third electrode 40, and the fourth electrode 50 are illustrated.

The third electrode 40 and the fourth electrode 50 each extend in a direction along the front surface 10F of the semiconductor part 10, e.g., the Y-direction. The first insulating film 45 is provided between the semiconductor part 10 and the third electrode 40. The third electrode 40 is insulated from the semiconductor part 10 by the first insulating film 45. The second insulating film 55 is provided between the semiconductor part 10 and the fourth electrode 50. The fourth electrode 50 is insulated from the semiconductor part 10 by the second insulating film 55.

As shown in FIG. 16, the semiconductor part 10 further includes a sixth semiconductor layer 16 of the first conductivity type. The sixth semiconductor layer 16 is, for example, an n-type contact layer. The sixth semiconductor layer 16 is partially provided on the second semiconductor layer 13 between the second semiconductor layer 13 and the second electrode 30 (see FIG. 1). The third semiconductor layer 15 and the sixth semiconductor layer 16 are arranged on the second semiconductor layer 13, and each extend in the Y-direction. The second electrode 30 (see FIG. 1) contacts the second, third and sixth semiconductor layers 13, 15 and 16.

The sixth semiconductor layer 16 is provided between the third semiconductor layer 15 and the first insulating film 45. The sixth semiconductor layer 16 contacts the first insulating film 45 and extends in the Y-direction along the first insulating film 45. The third semiconductor layer 15 contacts the sixth semiconductor layer 16. For example, the Z-direction length of the sixth semiconductor layer 16 is substantially equal to the Z-direction length of the third semiconductor layer 15.

The fourth semiconductor layer 17 is provided in the second semiconductor layer 13 between the first semiconductor layer 11 and the sixth semiconductor layer 16. The sixth semiconductor layer 16 is provided above the fourth semiconductor layer 17. The fourth semiconductor layer 17 contacts the first insulating film 45 and extends in the Y-direction along the first insulating film 45. The second semiconductor layer 13 extends between the first semiconductor layer 11 and the fourth semiconductor layer 17 and between the fourth semiconductor layer 17 and the sixth semiconductor layer 16. The second semiconductor layer 13 contacts the first insulating film 45.

The semiconductor part 10 further includes the second-third semiconductor layer 15, the second-fourth semiconductor layer 17, and a second-sixth semiconductor layer 16. The second semiconductor layer 13 extends between the third semiconductor layer 15 and the second-third semiconductor layer 15 and between the fourth semiconductor layer 17 and the second-fourth semiconductor layer 17. The second-fourth semiconductor layer 17 contacts the second insulating film 55 and extends in the Y-direction along the second insulating film 5.

The second-sixth semiconductor layer 16 is provided above the other fourth semiconductor layer 17. The second-sixth semiconductor layer 16 is provided between the second-third semiconductor layer 15 and the second insulating film 55. The second-sixth semiconductor layer 16 contacts the second insulating film 55 and extends in the Y-direction along the second insulating film 55. The second semiconductor layer 13 extends between the first semiconductor layer 11 and the second fourth semiconductor layer 17 and between the second-fourth semiconductor layer 17 and the second-sixth semiconductor layer 16. The second semiconductor layer 13 contacts the second insulating film 55.

Thus, by providing the fourth semiconductor layer 17 in the second semiconductor layer 13, the hole injection from the second semiconductor layer 13 into the first semiconductor layer 11 can be suppressed, and the recovery loss can be reduced.

Figure 17:
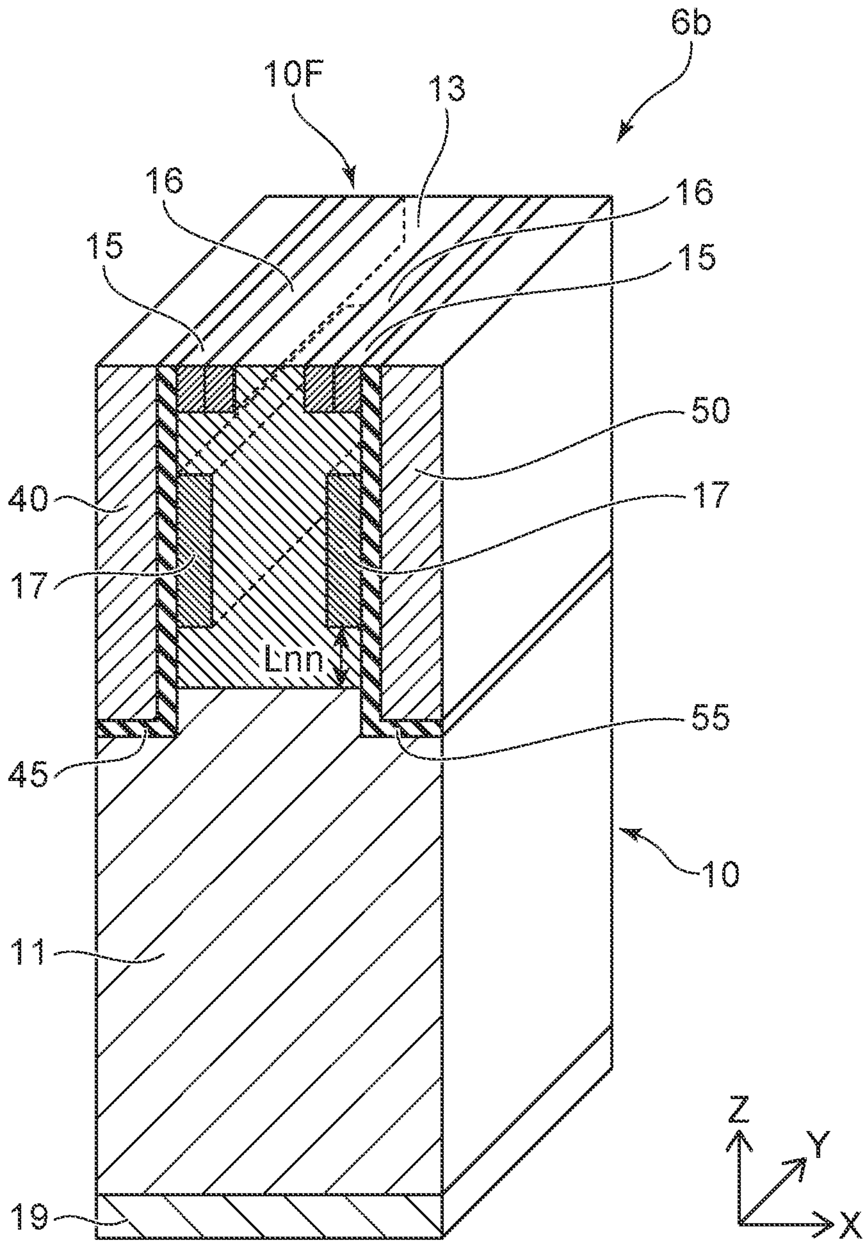
FIG. 17 is a schematic perspective view showing a semiconductor device according to a first modification of the third embodiment.

FIG. 17 is a schematic perspective view showing a semiconductor device 6*b* according to a first modification of the third embodiment. In the example, the third semiconductor layer 15 is provided between the sixth semiconductor layer 16 and the first insulating film 45. Also, the second-third semiconductor layer 15 is provided between the second-sixth semiconductor layer 16 and the second insulating film 55.

The second semiconductor layer 13 extends between the fourth semiconductor layer 17 and the second-fourth semiconductor layer 17 and between the sixth semiconductor layer 16 and the second-sixth semiconductor layer 16. The second semiconductor layer 13 extends between the first semiconductor layer 11 and the fourth semiconductor layer 17 and between the third semiconductor layer 15 and the fourth semiconductor layer 17 and contacts the first insulating film 45. The second semiconductor layer 13 extends between the first semiconductor layer 11 and the second-fourth semiconductor layer 17 and between the second-third semiconductor layer 15 and the second-fourth semiconductor layer 17 and contacts the second insulating film 55.

Figure 18:
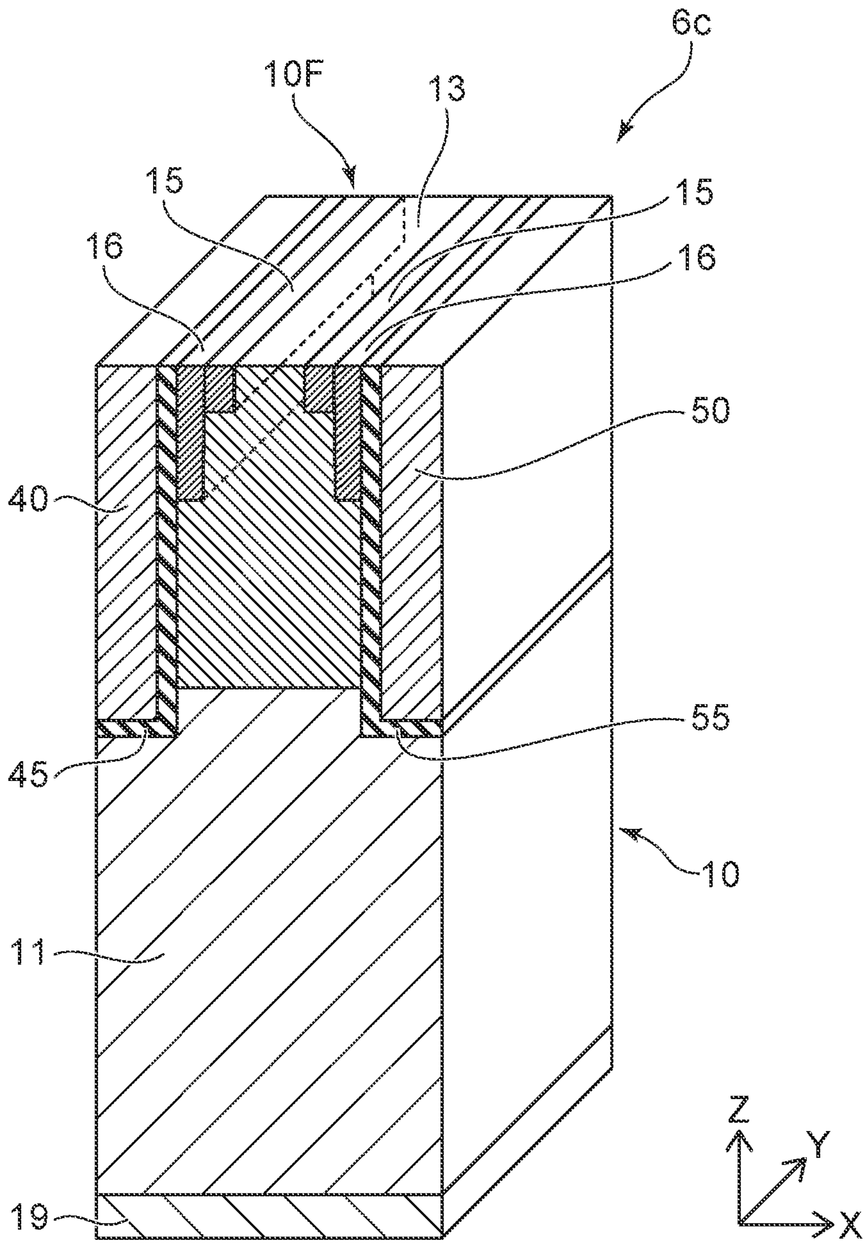
FIG. 18 is a schematic perspective view showing a semiconductor device according to a second modification of the third embodiment.

FIG. 18 is a schematic perspective view showing a semiconductor device 6*c* according to a second modification of the third embodiment. In the example, the sixth semiconductor layer 16 is provided between the third semiconductor layer 15 and the first insulating film 45. Also, the second-sixth semiconductor layer 16 is provided between the second-third semiconductor layer 15 and the first insulating film 45. The fourth semiconductor layer 17 is not provided; and the sixth semiconductor layer 16 extends downward (in the −Z direction) along the first and second insulating films 45 and 55. In other words, the Z-direction length of the sixth semiconductor layer 16 is greater than the Z-direction length of the third semiconductor layer 15.

Figure 19:
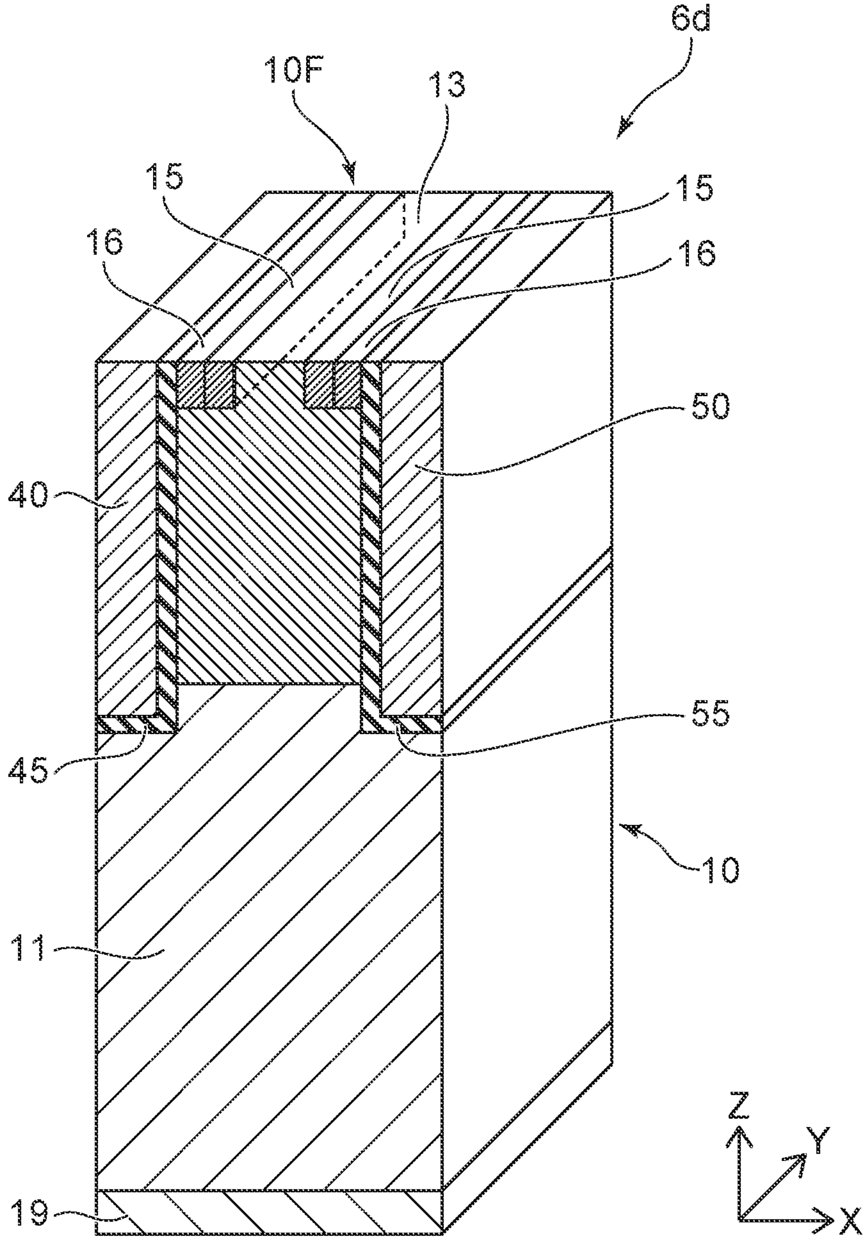
FIG. 19 is a schematic perspective view showing a semiconductor device according to a third modification of the third embodiment.

FIG. 19 is a schematic perspective view showing a semiconductor device 6*d* according to a third modification of the third embodiment. Also, in the example, the sixth semiconductor layer 16 is provided between the third semiconductor layer 15 and the first insulating film 45. The second-sixth semiconductor layer 16 is provided between the second-third semiconductor layer 15 and the first insulating film 45. The fourth semiconductor layer 17 is not provided in the second semiconductor layer 13.

Figure 20:
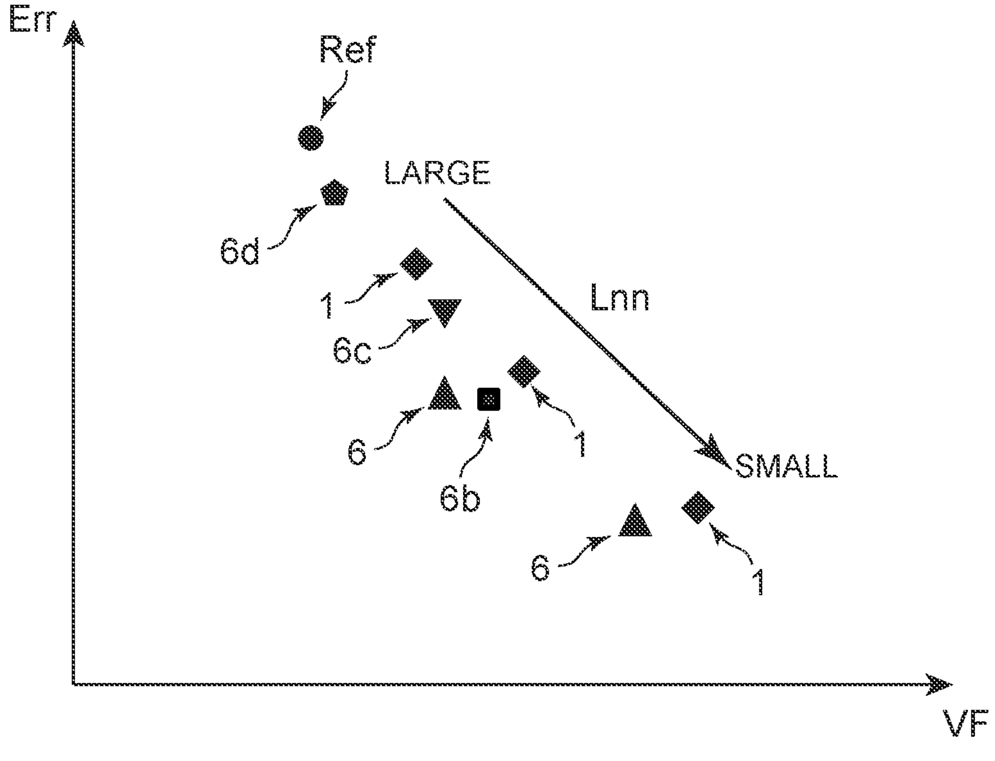
FIG. 20 is a graph showing characteristics of the semiconductor devices according to the third embodiment.

FIG. 20 is a graph showing characteristics of the semiconductor devices 6 to 6*d* according to the third embodiment. The horizontal axis is the forward voltage VF; and the vertical axis is the recovery loss Err. The characteristics of the semiconductor devices 1 and 6 to 6*d* are plotted in FIG. 20.

Comparing the characteristic of the semiconductor device 6 with the characteristic of the semiconductor device 1, VF is lower, and Err is lower. In other words, by providing the fourth semiconductor layer 17 in the second semiconductor layer 13, the small number of holes are injected into the first semiconductor layer 11; and VF is reduced by providing the sixth semiconductor layer 16. It can be seen that the recovery loss Err is further reduced thereby.

The semiconductor device 6*b* has a lower recovery loss Err than the semiconductor device 1. On the other hand, the semiconductor device 6*c* has substantially the same characteristic as the semiconductor device 1.

Compared to a semiconductor device according to a comparative example ("Ref" in FIG. 20) in which the fourth semiconductor layer 17 and the sixth semiconductor layer 16 are not included, the recovery loss Err of the semiconductor device 6*d* is reduced, but the reduction effect of the recovery loss Err is low compared to the devices in which the fourth semiconductor layer 17 is included.

Figure 21:
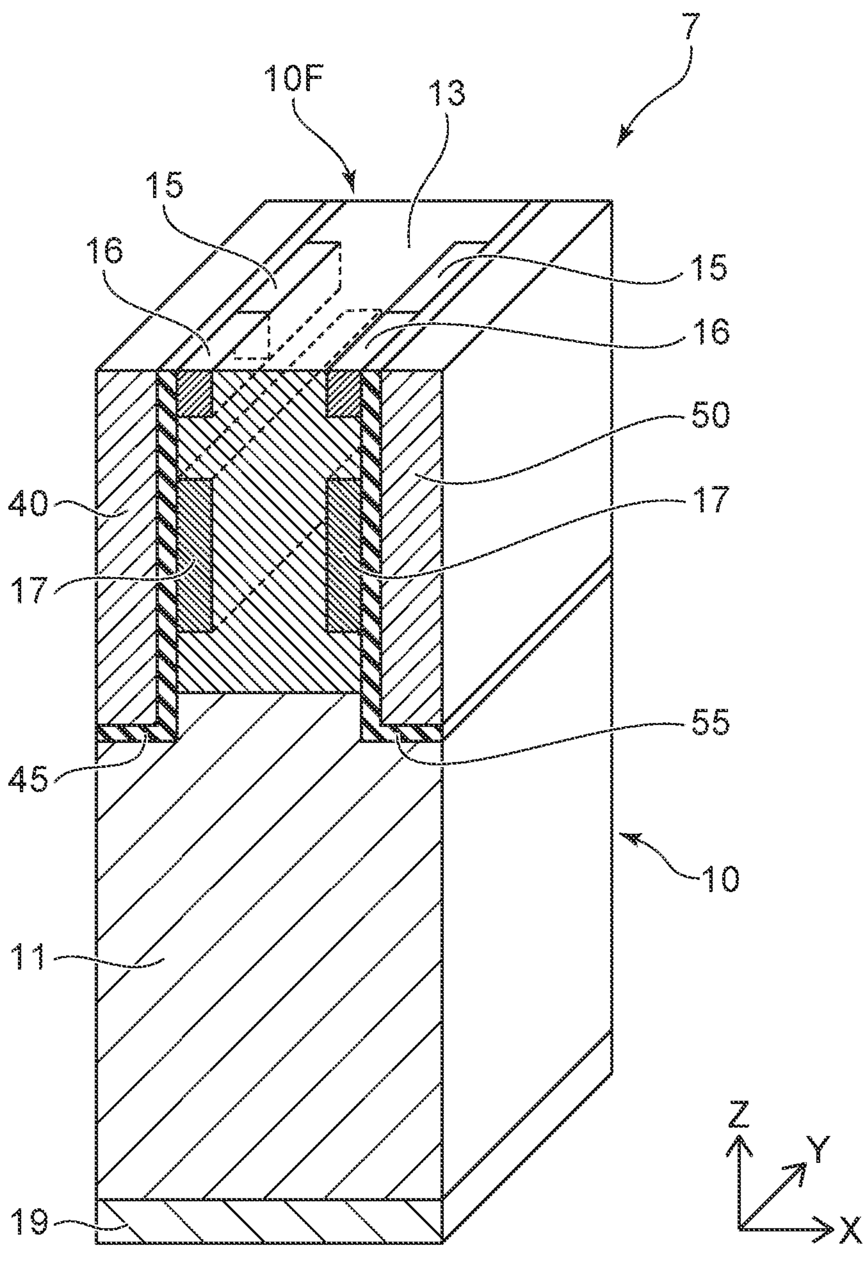
FIG. 21 is a schematic perspective view showing a semiconductor device according to a fourth modification of the third embodiment.

FIG. 21 is a schematic perspective view showing a semiconductor device 7 according to a fourth modification of the third embodiment. In the example, the third semiconductor layer 15 and the sixth semiconductor layer 16 both contact the first insulating film 45 and extend in the Y-direction. In other words, a p-type contact layer (the third semiconductor layer 15) and an n-type contact layer (the sixth semiconductor layer 16) are provided above the fourth semiconductor layer 17 and arranged in the Y-direction.

The second-third semiconductor layer 15 and the second-sixth semiconductor layer 16 both contact the second insulating film 55 and extend in the Y-direction. The second-third semiconductor layer 15 and the second-sixth semiconductor layer 16 are provided above the second-fourth semiconductor layer 17 and are arranged in the Y-direction.

The second semiconductor layer 13 is provided between the third semiconductor layer 15 and the second-third semiconductor layer 15, between the fourth semiconductor layer 17 and the second-fourth semiconductor layer 17, and between the sixth semiconductor layer 16 and the second-sixth semiconductor layer 16. The second semiconductor layer 13 extends between the third semiconductor layer 15 and the fourth semiconductor layer 17 and between the sixth semiconductor layer 16 and the fourth semiconductor layer 17 and contacts the first insulating film 45. The second semiconductor layer 13 also extends between the second-third semiconductor layer 15 and the second-fourth semiconductor layer 17 and between the second-sixth semiconductor layer 16 and the second-fourth semiconductor layer 17 and contacts the first insulating film 45. The second semiconductor layer 13 extends between the first semiconductor layer 11 and the fourth semiconductor layer 17 and contacts the first insulating film 45, and extends between the first semiconductor layer 11 and the second-fourth semiconductor layer 17 and contacts the second insulating film 5.

Also, in such a configuration, the forward voltage VF can be reduced, and the recovery loss Err can be reduced. The sixth semiconductor layer 16 according to the embodiment is not limited to the example above. For example, the sixth semiconductor layer 16 according to the embodiment is applicable to any of the semiconductor devices according to the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a semiconductor part including first to fourth semiconductor layers;

a first electrode provided on a back surface of the semiconductor part;

a second electrode provided on a front surface of the semiconductor part, the front surface being at a side opposite to the back surface;

a third electrode provided in a first trench and extending into the semiconductor part from the front surface side of the semiconductor part;

a first insulating film provided between the semiconductor part and the third electrode, the first insulating film electrically insulating the third electrode from the semiconductor part;

a fourth electrode provided in a second trench and extending into the semiconductor part from the front surface side of the semiconductor part, the second trench provided at a position next to the first trench; and a second insulating film provided between the semiconductor part and the fourth electrode, the second insulating film electrically insulating the fourth electrode from the semiconductor part, the first semiconductor layer of a first conductivity type extending between the first electrode and the second electrode, the second semiconductor layer of a second conductivity type being provided between the first semiconductor layer and the second electrode and extending between the third electrode and the fourth electrode, the third semiconductor layer of the second conductivity type being partially provided on the second semiconductor layer between the second semiconductor layer and the second electrode, the third semiconductor layer including a second-conductivity-type impurity with a higher concentration than the second semiconductor layer, the third semiconductor layer directly contacting the first insulating film, the fourth semiconductor layer of the first conductivity type being provided in the second semiconductor layer between the third electrode and the fourth electrode, the fourth semiconductor layer being apart from the third semiconductor layer, the second semiconductor layer extending between the third semiconductor layer and the fourth semiconductor layer, a bottom of the fourth semiconductor layer on a side toward the back surface of the semiconductor part being spaced apart from the first semiconductor layer, the second semiconductor layer extending between the first semiconductor layer and the fourth semiconductor layer, the second electrode being connected to the second and third semiconductor layers at the front surface of the semiconductor part, and the third semiconductor layer directly contacting the second electrode.

2. The device according to claim 1, wherein the fourth semiconductor layer directly contacts at least one of the first insulating film or the second insulating film.

3. The device according to claim 1, wherein the semiconductor part further includes a second-third semiconductor layer partially provided on the second semiconductor layer between the second electrode and the second semiconductor layer, the second-third semiconductor layer directly contacting the second insulating film.

4. The device according to claim 3, wherein the semiconductor part further includes a second-fourth semiconductor layer provided in the second semiconductor layer, the fourth semiconductor layer directly contacting the first insulating film, the second-fourth semiconductor layer contacting the second insulating film.

5. The device according to claim 4, wherein the second semiconductor layer extends between the fourth semiconductor layer and the second-fourth semiconductor layer.

6. The device according to claim 1, wherein the semiconductor part further includes a second-third semiconductor layer partially provided on the second semiconductor layer between the second electrode and the second semiconductor layer, and the third semiconductor layer and the second-third semiconductor layer are apart from each other.

7. The device according to claim 6, wherein the semiconductor part further includes a second-fourth semiconductor layer provided in the second semiconductor layer, and the fourth semiconductor layer and the second-fourth semiconductor layer are apart from each other.

8. The device according to claim 1, wherein the semiconductor part further includes fifth and sixth semiconductor layers, the fifth semiconductor layer of the first conductivity type being provided between the first semiconductor layer and the first electrode, the fifth semiconductor layer including a first-conductivity-type impurity with a higher concentration than a concentration of the first-conductivity-type impurity in the first semiconductor layer, the sixth semiconductor layer of the first conductivity type being partially provided on the second semiconductor layer between the second semiconductor layer and the second electrode, and the third semiconductor layer and the sixth semiconductor layer are arranged on the second semiconductor layer and connected to the second electrode.

9. The device according to claim 8, wherein the sixth semiconductor layer is provided between the third semiconductor layer and the first insulating film, and the fourth semiconductor layer is positioned between the first semiconductor layer and the sixth semiconductor layer.

10. The device according to claim 8, wherein the semiconductor part further includes a second-third semiconductor layer and a second-sixth semiconductor layer each provided on the second semiconductor layer between the second electrode and the second semiconductor layer, the third semiconductor layer being provided between the sixth semiconductor layer and the first insulating film, the second-third semiconductor layer being provided between the second-sixth semiconductor layer and the second insulating film, and the second semiconductor layer extends between the sixth semiconductor layer and the second-sixth semiconductor layer and is connected to the second electrode.

11. The device according to claim 10, wherein the third semiconductor layer and the sixth semiconductor layer contact the first insulating film; and the second-third semiconductor layer and the second-sixth semiconductor layer contact the second insulating film.

12. The device according to claim 1, wherein the semiconductor part further includes a second-fourth semiconductor layer provided in the second semiconductor layer, the fourth semiconductor layer and the second-fourth semiconductor layer are apart from each other, and the second semiconductor layer extends between the fourth semiconductor layer and the second-fourth semiconductor layer.

13. The device according to claim 1, wherein the fourth semiconductor layer directly contacts the first insulating film, and the second semiconductor layer extends between the fourth semiconductor layer and the second insulating film.

14. The device according to claim 1, wherein the entire third semiconductor layer is of the second conductivity type.

15. A semiconductor device, comprising:

a semiconductor part including first to fourth semiconductor layers;

a first electrode provided on a back surface of the semiconductor part;

a second electrode provided on a front surface of the semiconductor part, the front surface being at a side opposite to the back surface;

a third electrode provided in a first trench and extending into the semiconductor part from the front surface side of the semiconductor part;

a first insulating film provided between the semiconductor part and the third electrode, the first insulating film electrically insulating the third electrode from the semiconductor part;

a fourth electrode provided in a second trench and extending into the semiconductor part from the front surface side of the semiconductor part, the second trench provided at a position next to the first trench; and a second insulating film provided between the semiconductor part and the fourth electrode, the second insulating film electrically insulating the fourth electrode from the semiconductor part, the first semiconductor layer of a first conductivity type extending between the first electrode and the second electrode, the second semiconductor layer of a second conductivity type being provided between the first semiconductor layer and the second electrode and extending between the third electrode and the fourth electrode, the third semiconductor layer of the second conductivity type being partially provided on the second semiconductor layer between the second semiconductor layer and the second electrode, the third semiconductor layer including a second-conductivity-type impurity with a higher concentration than the second semiconductor layer, the fourth semiconductor layer of the first conductivity type being provided in the second semiconductor layer between the third electrode and the fourth electrode, the fourth semiconductor layer being apart from the third semiconductor layer, the second semiconductor layer extending between the third semiconductor layer and the fourth semiconductor layer, the second electrode being connected to the second and third semiconductor layers at the front surface of the semiconductor part, wherein the semiconductor part further includes fifth and sixth semiconductor layers, the fifth semiconductor layer of the first conductivity type being provided between the first semiconductor layer and the first electrode, the fifth semiconductor layer including a first-conductivity-type impurity with a higher concentration than a concentration of the first-conductivity-type impurity in the first semiconductor layer, the sixth semiconductor layer of the first conductivity type being partially provided on the second semiconductor layer between the second semiconductor layer and the second electrode, the third semiconductor layer and the sixth semiconductor layer are arranged on the second semiconductor layer and connected to the second electrode, and the third semiconductor layer is provided between the sixth semiconductor layer and the first insulating film in a first direction along the front surface of the semiconductor part.

16. The device according to claim 15, wherein the third semiconductor layer directly contacts the second electrode.

17. The device according to claim 15, wherein the fourth semiconductor layer is longer than the third semiconductor layer in a second direction from the first electrode to the second electrode.

18. The device according to claim 15, wherein the sixth semiconductor layer is provided between the second semiconductor layer and the third semiconductor layer in the first direction.

19. The device according to claim 15, wherein a bottom of the sixth semiconductor layer on a side toward the back surface of the semiconductor part directly contacts the second semiconductor layer.

20. The device according to claim 15, wherein the semiconductor part further includes a second-third semiconductor layer and a second-sixth semiconductor layer each provided on the second semiconductor layer between the second electrode and the second semiconductor layer, the second-third semiconductor layer is provided between the second-sixth semiconductor layer and the second insulating film in the first direction, and the second semiconductor layer extends between the sixth semiconductor layer and the second-sixth semiconductor layer and is connected to the second electrode.

* * * * *